United States Patent
Parashar et al.

(10) Patent No.: US 10,495,677 B2
(45) Date of Patent: Dec. 3, 2019

(54) ANGLE-BASED MANAGEMENT OF A POWER GRID SYSTEM

(71) Applicant: General Electric Technology GmbH, Baden (CH)

(72) Inventors: Manu Parashar, Seattle, WA (US); Anil Jampala, Bothell, WA (US); Jay Giri, Redmond, WA (US); Saugata Biswas, Kirkland, WA (US)

(73) Assignee: General Electric Technology GmbH, Baden (CH)

( * ) Notice: Subject to any disclaimer, the term of this patent is extended or adjusted under 35 U.S.C. 154(b) by 538 days.

(21) Appl. No.: 15/145,385

(22) Filed: May 3, 2016

(65) Prior Publication Data

US 2016/0334447 A1 Nov. 17, 2016

Related U.S. Application Data

(60) Provisional application No. 62/161,364, filed on May 14, 2015.

(51) Int. Cl.
*G01R 25/00* (2006.01)
*G08B 21/18* (2006.01)
(Continued)

(52) U.S. Cl.
CPC ........... *G01R 25/00* (2013.01); *G01R 21/133* (2013.01); *G01R 31/40* (2013.01); *G08B 21/18* (2013.01);
(Continued)

(58) Field of Classification Search
CPC ...... G01R 25/00; G01R 21/133; G01R 31/40; G08B 21/18; H02J 3/382; H02J 3/383;
(Continued)

(56) References Cited

U.S. PATENT DOCUMENTS 3,325,650 A * 6/1967 Barnes ............... H02P 9/04
290/40 R
3,889,106 A * 6/1975 Alliston ............... G09B 9/00
376/217
(Continued)

FOREIGN PATENT DOCUMENTS

GB 2514415 A 11/2014
WO 2010077830 A2 7/2010

OTHER PUBLICATIONS

Extended European Search Report dated Aug. 4, 2016 for European Application Serial No. 16168707.4, 8 pages.
European Office Action dated Nov. 21, 2016 for European Application Serial No. 16168707.4, 2 pages.

*Primary Examiner* — Peniel M Gumedzoe
(74) *Attorney, Agent, or Firm* — Fitch Even Tabin & Flannery LLP

(57) ABSTRACT

Energy flow in a power grid system (e.g., an electrical energy distribution system) is managed. In an example embodiment, a system provides for generating monitoring data for an electrical energy distribution system based on power-flow data for the electrical energy distribution system and topology data for the electrical energy distribution system. The power-flow data is indicative of voltage values that are repeatedly obtained from the electrical energy distribution system. The topology data is indicative of a topology for the electrical energy distribution system. The system also provides for identifying, based on the monitoring data, a change in a voltage angle associated with a transmission line in the electrical energy distribution system. Furthermore, the system provides for generating a notification for a graphical user interface in response to a determination that the change in the voltage angle for the transmission line satisfies a defined criterion.

20 Claims, 14 Drawing Sheets

(51) Int. Cl.
*H02J 3/38* (2006.01)
*G01R 21/133* (2006.01)
*G01R 31/40* (2014.01)
*H02J 13/00* (2006.01)
*H02J 3/00* (2006.01)

(52) U.S. Cl.
CPC .............. *H02J 3/382* (2013.01); *H02J 3/383* (2013.01); *H02J 3/386* (2013.01); *H02J 13/0006* (2013.01); *H02J 2003/007* (2013.01); *Y02E 60/74* (2013.01); *Y02E 60/76* (2013.01); *Y04S 10/30* (2013.01); *Y04S 40/22* (2013.01)

(58) Field of Classification Search
CPC .. H02J 3/386; H02J 13/0006; H02J 2003/007; Y02E 60/74; Y02E 60/76; Y04S 10/30; Y04S 40/22
See application file for complete search history.

(56) References Cited

U.S. PATENT DOCUMENTS

| | | | | |
|---|---|---|---|---|
| 4,156,174 A | * | 5/1979 | Specht | H02J 3/06 323/342 |
| 4,795,983 A | * | 1/1989 | Crockett | G01R 27/18 324/509 |
| 2006/0004531 A1 | * | 1/2006 | Ye | G01R 19/2513 702/60 |
| 2006/0067095 A1 | * | 3/2006 | Hou | H02J 3/24 363/78 |
| 2009/0243628 A1 | * | 10/2009 | Andarawis | H03D 13/00 324/601 |
| 2010/0292857 A1 | | 11/2010 | Bose et al. | |
| 2011/0282508 A1 | | 11/2011 | Goutard et al. | |
| 2014/0039712 A1 | * | 2/2014 | Bell | G05B 13/04 700/291 |

* cited by examiner

ANGLE-BASED MANAGEMENT OF A POWER GRID SYSTEM

RELATED APPLICATION

This application claims priority to U.S. Provisional Patent Application No. 62/161,364, filed May 14, 2015, and entitled "Enhanced Angle-based Grid Management", the entirety of which application is hereby incorporated herein by reference.

TECHNICAL FIELD

The disclosed subject matter relates to managing energy flow in a power grid system.

BACKGROUND

A power grid is a complex and dynamic system that is difficult to manage. Often times, a power grid includes numerous power grid devices and a complex system of transmission lines. Furthermore, a power grid is often integrated with other power grids, resulting in a large-scale power grid system. Steady state stresses and/or dynamic stresses on a power grid can occur due to power transfers and/or grid outages in the power grid. Therefore, a power grid is often vulnerable to potential blackouts. It is therefore desirable to determine inefficiencies and/or abnormalities associated with energy flow in the power grid. However, an energy flow calculation for a power grid is often inaccurate and/or difficult to obtain using conventional techniques. Furthermore, managing energy flow in a power grid using conventional techniques is often difficult, complex and/or unreliable.

The above-described background relating to power grid systems is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification, nor delineate any scope of the particular implementations of the specification or any scope of the claims. Its sole purpose is to present some concepts of the specification in a simplified form as a prelude to the more detailed description that is presented later.

In accordance with an example embodiment, a system provides for generating monitoring data for an electrical energy distribution system based on power-flow data for the electrical energy distribution system and topology data for the electrical energy distribution system. The power-flow data is indicative of voltage values that are repeatedly obtained from the electrical energy distribution system. The topology data is indicative of a topology for the electrical energy distribution system. The system also provides for identifying, based on the monitoring data, a change in a voltage angle associated with a transmission line in the electrical energy distribution system. Furthermore, the system provides for generating a notification for a graphical user interface in response to a determination that the change in the voltage angle for the transmission line satisfies a defined criterion.

In accordance with another example embodiment, a method provides for generating topology data that is indicative of an arrangement and a power status of devices in an electrical energy distribution system, generating power-flow data that is indicative of voltage parameters associated with the electrical energy distribution system, identifying, based on the topology data and the power-flow data, a change in a voltage angle associated with a transmission line coupled between a first location and a second location in the electrical energy distribution system, and displaying a notification for a graphical user interface in response to a determination that the change in the voltage angle for the transmission line satisfies a defined criterion.

In accordance with yet another example embodiment, a computer readable storage device comprises executable instructions that, in response to execution, cause a device comprising a processor to perform operations, comprising: obtaining topology data that is indicative of a topology calculation for a power grid system, repeatedly obtaining power-flow data during a period of time, identifying, based on the topology data and the power-flow data, a change in a voltage angle associated with a transmission line in the power grid system, and presenting a notification on a display of another device in response to a determination that the change in the voltage angle for the transmission line satisfies a defined criterion.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

DETAILED DESCRIPTION

Figure 1:
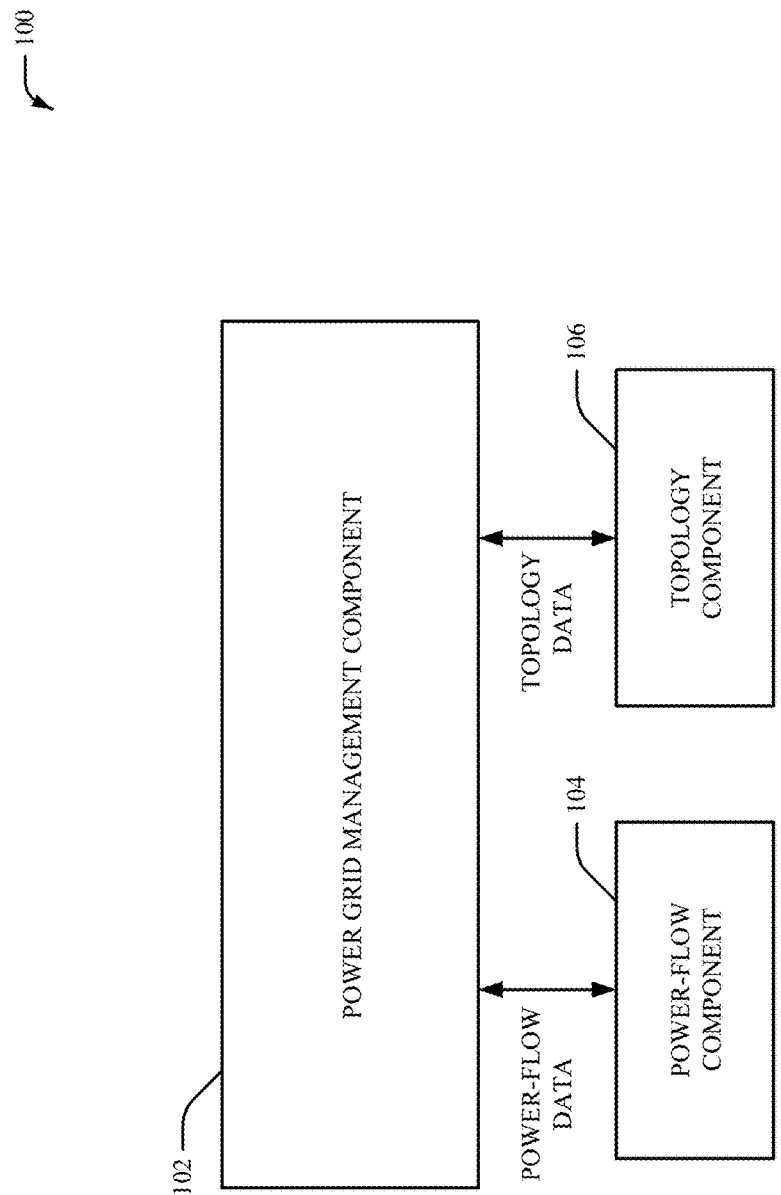
FIG. 1 illustrates a system that facilitates managing energy flow in a power grid system in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As used in this application, the terms "component," "system," "platform," "interface," "node", "source", "agent", and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A power grid is a complex and dynamic system that is difficult to manage. Often times, a power grid includes numerous power grid devices and a complex system of transmission lines. Furthermore, a power grid is often integrated with other power grids, resulting in a large-scale power grid system. Steady state stresses and/or dynamic stresses on a power grid can occur due to power transfers and/or grid outages in the power grid. Therefore, a power grid is often vulnerable to potential blackouts. It is therefore desirable to determine inefficiencies and/or abnormalities associated with energy flow in the power grid. However, an energy flow calculation for a power grid is often inaccurate and/or difficult to obtain using conventional techniques. Furthermore, managing energy flow in a power grid using conventional techniques is often difficult, complex and/or unreliable.

To these and/or related ends, techniques for managing energy flow in a power grid system (e.g., an electrical energy distribution system) for improved performance of the power grid system are presented. For example, voltage angle-based information for a power grid system, along with topology information for the power grid system, can be employed to detect, assess, and/or alleviate (e.g., optimally alleviate) grid stress in the power grid system and/or abnormalities associated with energy flow in the power grid system. The voltage angle-based information (e.g., voltage angle data) can be indicative of real-time voltage angle separation in the power grid system. As such, voltage angle separation in the power grid system can be predicted in real-time. In an aspect, phase angle differences between a source region and sink region of a power grid system can be employed to determine steady state grid stress associated with the power grid system. In another aspect, phase angle rate of change patterns can be employed to detect and/or characterize grid stress associated with the power grid system. In an embodiment, voltage angle-based information (e.g., voltage angle-based information obtained from phasor measurement unit(s)) and grid topology information for a power grid system can be combined to determine line outage distribution factors that predict changes in phase angle difference and/or to compute model-based sensitivity information for the power grid system. As such, grid stress and/or transmission congestion of a power grid system can be alleviated. Furthermore, phase angle differences in a power grid system can be reduced. Moreover, enhanced stability for a power grid system can be provided.

FIG. 1 is an illustration of a system 100, which facilitates managing energy flow in a power grid system (e.g., an electrical energy distribution system) in accordance with aspects of the subject disclosure. System 100 includes a power grid management component 102. Additionally, the system 100 can include a power-flow component 104 and/or a topology component 106. The power grid management component 102 can be coupled to and/or integrated with the power-flow component 104 and/or the topology component 106.

The power grid management component 102 can be implemented as (and/or can be associated with) a power grid management system. The power grid management component 102 can identify power grid system events through various power grid system quantities such as power flow, power grid topology, dynamic phase angle separation and/or rate of change of frequency from different parts of the power grid system. In example embodiments, the power grid management component 102 can be integrated with a control center system that manages power transmission and/or power distribution associated with a power grid system (e.g., an electrical energy distribution system). For example, the control center system can measure, analyze and/or control power transmission and/or power distribution associated with the power a power grid system (e.g., an electrical energy distribution system). The control center system can additionally or alternatively manage other real-time operations associated with the power grid system (e.g., the electrical energy distribution system). Furthermore, the power grid management component 102 can operate using a distribution network model, a model of utility customers where customers are connected with respect to the power grid system (e.g., the electrical energy distribution system), and/or a set of observations associated with the power grid system (e.g., the electrical energy distribution system). In an aspect, the system 100 and/or the power grid management component 102 can be associated with a grid stability assessment system. In another aspect, the system 100 and/or the power grid management component 102 can be associated with an angle-based grid monitoring application.

The power-flow component 104 can generate and/or provide power-flow data (e.g., POWER-FLOW DATA shown in FIG. 1). The power grid management component 102 can repeatedly receive the power-flow data from the power-flow component 104. The power-flow data can be associated with voltage measurements and/or current measurements. The power-flow data can be indicative of power-flow measurements that are repeatedly obtained from a power grid system (e.g., an electrical energy distribution system) managed by the power grid management component 102. For example, the power-flow data can be indicative of a set of voltage values (e.g., a set of measured voltage values) that are repeatedly obtained from a power grid system (e.g., an electrical energy distribution system) managed by the power grid management component 102. Furthermore, in one example, the power-flow data can be phasor data (e.g., phasor voltage data). The power-flow data can also be time-tagged and/or location-tagged. The power-flow component 104 can be associated with a set of meters (e.g., smart meters, meter equipment, etc.) and/or communication networks associated with the power grid system. The set of meters associated with the power grid system can provide information to the power-flow component 104 (and/or the power grid management component 102) via communication network(s) between the set of meters and the power-flow component 104 (and/or the power grid management component 102). For example, each meter from the set of meters can determine consumption of power (e.g., electric energy) during a certain period of time. Furthermore, the consumption of power determined by each meter from the set of meters can be provided (e.g., transmitted) to the power grid management component 102. In an aspect, the set of meters can provide automatic and/or real-time meter readings to the power-flow component 104 (and/or the power grid management component 102).

The topology component 106 can generate and/or provide topology data (e.g., TOPOLOGY DATA shown in FIG. 1). The power grid management component 102 can repeatedly receive the topology data from the power-flow component 104. The topology data can be indicative of a topology for the power grid system (e.g., the electrical energy distribution system) managed by the power grid management component 102. For example, the topology data can be indicative of an arrangement and/or a power status of devices in the power grid system. The topology component 106 can employ connectivity information and/or switching operation information to generate the topology data (e.g., to construct a network topology of the power grid system). Furthermore, the topology component 106 can generate and/or provide the topology data based on a location of devices in the power grid system, a connection status of devices in the power grid system and/or a connectivity state of devices in the power grid system. For example, the topology data can be generated based on connectivity statuses and/or connectivity states of devices in the power grid system (e.g., devices that receive and/or process power distributed in throughout the power grid system). The topology data can also indicate which devices in the power grid system are connected to other devices in the power grid system (e.g., where devices in the power grid system are connected, etc.) and/or which devices in the power grid system are associated with a powered grid connection. For example, the topology component 106 can generate the topology data based on a location of devices with respect to the power grid system (e.g., with respect to other devices in the power grid system). The topology data can further be generated based on a status of power sources (e.g., a transformer, an electrical substation, etc.) that provide power in the power grid system. The topology data can also include the status of the power sources.

Additionally or alternatively, the topology component 106 can generate and/or provide the topology data based on statuses for switching operations associated with devices in the power grid system. A switching operation can be an operation to interrupt, de-energize and/or disconnect a portion of the power grid system (e.g., one or more devices in the power grid system). For example, a switching operation can be an operation to open one or more switches associated with a device in the power grid system (e.g., the switching operation can be an operation to disconnect one or more transmission lines associated with a device in the power grid system). It is to be appreciated that a switching operation can alternatively be an operation to energize and/or connect a portion of (e.g., one or more devices in) the power grid system. For example, a switching operation can be an operation to close one or more switches associated with a device in the power grid system (e.g., the switching operation can be an operation to connect one or more transmission lines associated with a device in the power grid system). Additionally or alternatively, the topology data can identify where and/or how devices are connected (e.g., to other devices, via particular transmission lines, etc.) within the power grid system. Furthermore, the topology data can provide connectivity states of the devices in the power grid system (e.g., based on connection points, based on busses, etc.).

In example embodiments, the topology component 106 can determine connectivity information and/or switching operation information associated with the power grid system based on reports associated with the power grid system. The reports can be associated with devices and/or particular locations associated with the power grid system. In an aspect, the reports can be generated based on phone calls and/or voice logs received from user identities (e.g., customers) in the power grid system. For example, a customer (e.g., a customer with a device linked to a transformer) can call a control center associated with the power grid management component 102 to report a power outage in the power grid system. Furthermore, information provided to the control center by the customer can be employed to generate the reports. In one example, the reports can be generated based on interactive voice response data provided by customers during phone calls to the control center. The reports can also be generated based on weather events and/or other information associated with external systems and/or regional transmission organizations. Additionally, the reports can include a list of alarms related to an interruption in the power grid system. In an aspect, the power-flow data and/or the topology data can be generated based on coded (e.g., encoded) feedback data received from devices in the power grid system.

The power grid management component 102 can analyze the power-grid data (e.g., power flows in the power grid system) and/or the topology data. The power grid management component 102 can employ the power-flow data and/or the topology data to manage energy flow in the power grid system. For example, the power grid management component 102 can employ the power-flow data and/or the topology data to detect power transfers and/or power grid outages in the power grid system. A power transfer can be a condition associated with the power grid system where power is transferred (e.g., disproportionally transferred) from a portion of the power grid system to another portion of the power grid system. A power outage can be a condition associated with the power grid system where at least one device in the power grid system does not receive power (e.g., where at least one device in the power grid system is de-energized). The power grid management component 102 can also employ the power-flow data and/or the topology data to assess power transfers and/or power grid outages in the power grid system. Moreover, power grid management component 102 can also employ the power-flow data and/or the topology data to predict voltage angle changes for certain monitored portions of the power grid system (e.g., certain monitored corridors of the power grid system). Therefore, the power grid management component 102 can alleviate power grid stress of the power grid system.

In an embodiment, the power grid management component 102 can identify changes associated with the power-flow data to facilitate management of energy flow in the power grid system. In one example, the power grid management component 102 can identify a rate of change associated with the power-flow data. As such, the power grid management component 102 can identify changes in flow of electrical power in the power grid system. In an aspect, the power grid management component 102 can identify a change in voltage angles associated with the power-flow data. For example, the power grid management component 102 can identify a rate of change in voltage angles associated with the power-flow data. The power grid management component 102 can identify the change in the voltage angles (e.g., the rate of change in the voltage angles) based on defined voltage patterns for the power grid system. Defined voltage patterns can be generated and/or employed for various portions of the power grid system. For example, a defined voltage pattern can be associated with a sector of the power grid system, a corridor of the power grid system a transmission line of the power grid system, a flowgate of the power grid system and/or a device of the power grid system and/or a device. Additionally or alternatively, the power grid management component 102 can identify the change in the voltage angles (e.g., the rate of change in the voltage angles) based on a power flow technique that analyzes power flow associated with the power grid system (e.g., power flow associated with a sector of the power grid system, power flow associated with a corridor of the power grid system, power flow associated with a transmission line of the power grid system, power flow associated with a device of the power grid system, power flow associated with a flowgate of the power grid system, etc.). In one example, the power flow technique can be a Fast Decoupled Power Flow (FDPF) technique. However, it is to be appreciated that the power flow technique can be a different type of power flow technique that analyzes power flow.

In another aspect, the power grid management component 102 can compute voltage angle separation between a first location in the power grid system (e.g., a source location, a first node, a first geographic location, etc.) and a second location in the power grid system (e.g., a sink location, a second node, a second geographic location, etc.) in a power grid system based on the power-flow data and/or the topology data. A transmission line can be coupled between the first location in the power grid system and the second location in the power grid system, for example. Additionally or alternatively, a first device (e.g., a first power grid device, a first transformer device, etc,) can be associated with the first location and a second device (e.g., a second power grid device, a second transformer device, etc,) can be associated with the second location. In one example, the power grid management component 102 can compute linear sensitivities of the voltage angle separation between the first location in the power grid system and the second location in the power grid system. The power grid management component 102 can, for example, model linear sensitivities of the voltage angle separation between the first location in the power grid system and the second location in the power grid system using a flowgate device with respect to a set of defined branch contingencies associated with the power grid system (e.g., a set of predetermined N−1 branch contingencies). A defined branch contingency can be a portion of the power grid system such as, for example, a transmission line, a power grid device (e.g., a transformer device), etc. The power grid management component 102 can also employ line outage distribution factors and/or line outage angle difference sensitivity values to compute linear sensitivities of the voltage angle separation between the first location in the power grid system and the second location in the power grid system. In example embodiments, the power grid management component 102 can compute predicted values of the voltage angle separation between the first location in the power grid system and the second location in the power grid system based on the power-flow data and/or the topology data. The power grid management component 102 can compute predicted values of the voltage angle separation for the set of defined branch contingencies associated with the power grid system (e.g., all branch contingencies in the set of predetermined N−1 branch contingencies). Furthermore, the power grid management component 102 can determine a worst possible branch contingency for the power grid system.

The power grid management component 102 can compute sensitivity values (e.g., line outage angle difference sensitivity values) for a power grid system based on power flow equations, such as, for example, fast decoupled power flow equations. For example, the power grid management component 102 can determine change in real power ($\Delta P$) based on the following Equation 1: $[\Delta P]=-[B']\times[\Delta\delta]$, where B' is a power flow variable (e.g., a power flow matrix) and $\Delta\delta$ is change in phase angle. Therefore, the power grid management component 102 can determine change in phase angle ($\Delta\delta$) based on the following Equation 2: $[\Delta\delta]=-[B']^{-1}\times[\Delta P]$.

In a non-limiting example to simulate power flow of 1 MW real power in a contingent branch PQ of a power grid system, it can be assumed that an extra 1 MW real power is injected (e.g., +ve injection) at first location (e.g., a first bus implemented as a source R) of the contingent branch PQ and taken out (e.g., −ve injection) at a second location (e.g., a second bus implemented as a sink S) of the contingent branch PQ. The contingent branch PQ can be between a first bus P and a second bus Q. The power grid management component 102 can determine impact of the power flow of 1 MW in the contingent branch based on angles of a monitored corridor of the power grid system. For example, change in phase angle $\Delta\delta_{RS}$ between the first location and the second location can be equal to ($\Delta\delta_R - \Delta\delta_S$). As such, the power grid management component 102 can apply this non-limiting example to Equation 2 as follows:

$$\begin{bmatrix} \Delta\delta_i \\ \vdots \\ \vdots \\ \vdots \\ \Delta\delta_R \\ \Delta\delta_S \\ \vdots \\ \Delta\delta_n \end{bmatrix} = - \begin{bmatrix} \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & B'_{RP} & B'_{RQ} & \vdots & \vdots & \vdots & \vdots \\ \vdots & \vdots & B'_{SP} & B'_{SQ} & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \end{bmatrix}^{-1} \times \begin{bmatrix} \Delta P_i \\ \vdots \\ \Delta P_P \\ \Delta P_Q \\ \vdots \\ \vdots \\ \vdots \\ \Delta P_n \end{bmatrix} \rightarrow$$ (Equation 3)

$$\rightarrow \begin{bmatrix} \Delta\delta_i \\ \vdots \\ \vdots \\ \vdots \\ \Delta\delta_R \\ \Delta\delta_S \\ \vdots \\ \Delta\delta_n \end{bmatrix} = \begin{bmatrix} \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & Z_{RP} & Z_{RQ} & \vdots & \vdots & \vdots & \vdots \\ \vdots & \vdots & Z_{SP} & Z_{SQ} & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \end{bmatrix} \times \begin{bmatrix} 0 \\ \vdots \\ \Delta P_P = +1 \\ \Delta P_Q = -1 \\ \vdots \\ \vdots \\ \vdots \\ 0 \end{bmatrix} \rightarrow$$ (Equation 4)

Therefore, the power grid management component 102 can compute change in phase angle $\Delta\delta_R$ for source R by the following Equation 5:

$$\Delta\delta_R = Z_{RP} \times (+1) + Z_{RQ} \times (-1) \rightarrow \Delta\delta_R = Z_{RP} - Z_{RQ}$$

Furthermore, the power grid management component 102 can compute change in phase angle $\Delta\delta_S$ for sink S by the following Equation 6:

$$\Delta\delta_S = Z_{SP} \times (+1) + Z_{SQ} \times (-1) \rightarrow \Delta\delta_S = Z_{SP} - Z_{SQ}$$

From Equation 5 and Equation 6, the power grid management component 102 can compute change in angle separation of the monitored corridor due to 1 MW power flow in the contingent branch is given as:

$$\Delta\delta_{RS} = \Delta\delta_R - \Delta\delta_S = Z_{RP} - Z_{RQ} - (Z_{SP} - Z_{SQ})$$

Accordingly, the power grid management component 102 can compute a sensitivity value LOADS (e.g., line outage angle difference sensitivity) using the following Equation 7: LOADS=$\Delta\delta_{RS}$=$Z_{RP}$−$Z_{RQ}$−$Z_{SP}$+$Z_{SQ}$. A variable Z can represent, for example, a real power variable (e.g., a real power matrix). In example embodiments, a flowgate may be comprised of more than one branch or component. For example, if a flowgate RS is formed using three physically connected (or contiguous) facilities (e.g., a first facility RA, a second facility AB, and a third facility BS), then the sensitivity value LOADS for the flowgate RS can be computed using the following Equation 8: LOADS=$\Delta\delta_{RS}$=$\Delta\delta_{RA}$+$\Delta\delta_{AB}$+$\Delta\delta_{BS}$.

The sensitivity value LOADS can provide change in voltage angle separation of across a source-sink pair RS (e.g., a Flowgate RS) per MW change in power flow in the contingent branch PQ. The power grid management component 102 can also obtain a predicted value of angle separation across a flowgate for a single N−1 branch contingency based on the following Equation 9: $\Delta\delta_{RS\_PQ}$=LOADS×$P_{PQ}$. The power grid management component 102 can determine a predicted value of voltage angle separation across a flowgate RS for an outage of a single branch by looping around all contingencies in a set of defined branch contingencies (e.g., a predetermined list of N−1 branch contingencies).

Figure 2:
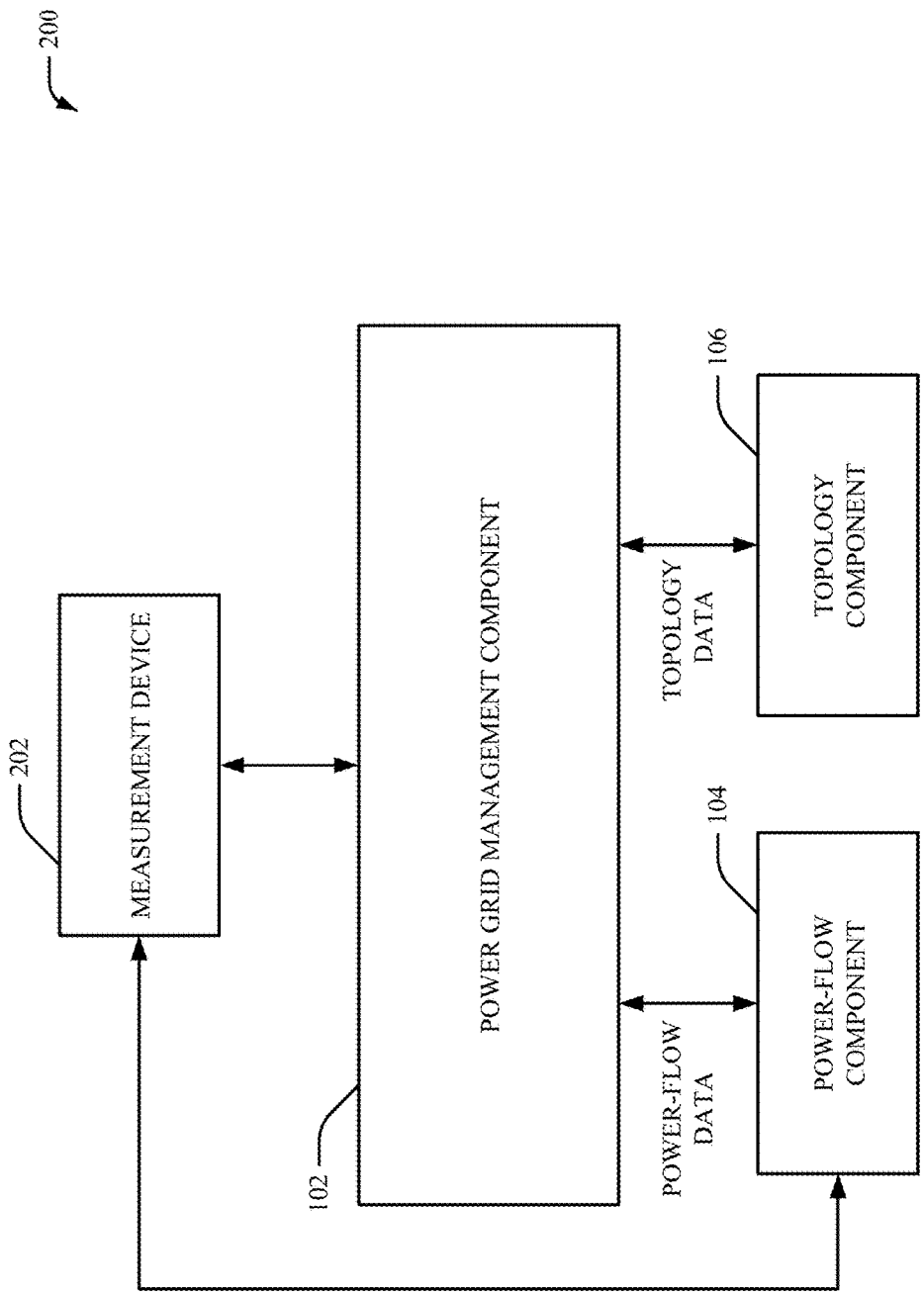
FIG. 2 illustrates another system that facilitates managing energy flow in a power grid system in accordance with aspects of the subject disclosure.

FIG. 2 is a diagram of an example system 200 in accordance with aspects of the subject disclosure. System 200 includes the power grid management component 102. Additionally, the system 200 can include the power-flow component 104, the topology component 106 and/or a measurement device 202. It is to be appreciated that the measurement device 202 can be implemented as and/or associated with more than one measurement device. The measurement device 202 can obtain, monitor, determine and/or analyze electrical characteristics and/or electrical parameters associated with the power grid system (e.g., the electrical distribution system). The measurement device 202 can be a device such as, for example, a phasor measurement device (e.g., a phasor measurement unit). In one example, the measurement device 202 can be a synchrophasor. Additionally or alternatively, the measurement device 202 can be a monitoring device. However, it is to be appreciated that the measurement device 202 can additionally include, or alternatively be implemented as, another type of device to obtain, monitor and/or determine electrical characteristics associated with the power grid system (e.g., the electrical distribution system). The measurement device 202 can also include and/or be associated with a protection relay, a global positioning system (GPS), a phasor data concentrator, communication capabilities and/or other functionalities.

The measurement device 202 can be coupled to at least a portion of the power grid system (e.g., the electrical distribution system) associated with the power grid management component 102. For example, the measurement device 202 can be coupled to a transmission line, a flowgate, and/or a device included in the power grid system (e.g., the electrical distribution system). Furthermore, the measurement device 202 can be associated with a particular sector of the power grid system (e.g., the electrical distribution system) and/or a particular corridor of the power grid system (e.g., the electrical distribution system).

The measurement device 202 can provide real-time measurements for electrical characteristics and/or electrical parameters associated with the power grid system (e.g., the electrical distribution system). The measurement device 202 can, for example, repeatedly obtain measurements from the power grid system (e.g., the electrical distribution system) associated with the power grid management component 102. Measurements obtained by the measurement device 202 can be associated with the power-flow data. For example, the measurement device 202 can repeatedly obtain the power-flow data and/or data employed to generate the power-flow data. In aspect, the measurement device 202 can repeatedly obtain the measurements from the power grid system during an interval of time that is less than one second. For example, the measurement device 202 can repeatedly obtain sub-second measurements from the power grid system. In a non-limiting example, an interval of time for obtaining the measurements from the power grid system can be 30 femtoseconds. In an aspect, data generated and/or obtained by the measurement device 202 can be coded data (e.g., encoded data) associated with the power grid system.

Figure 3:
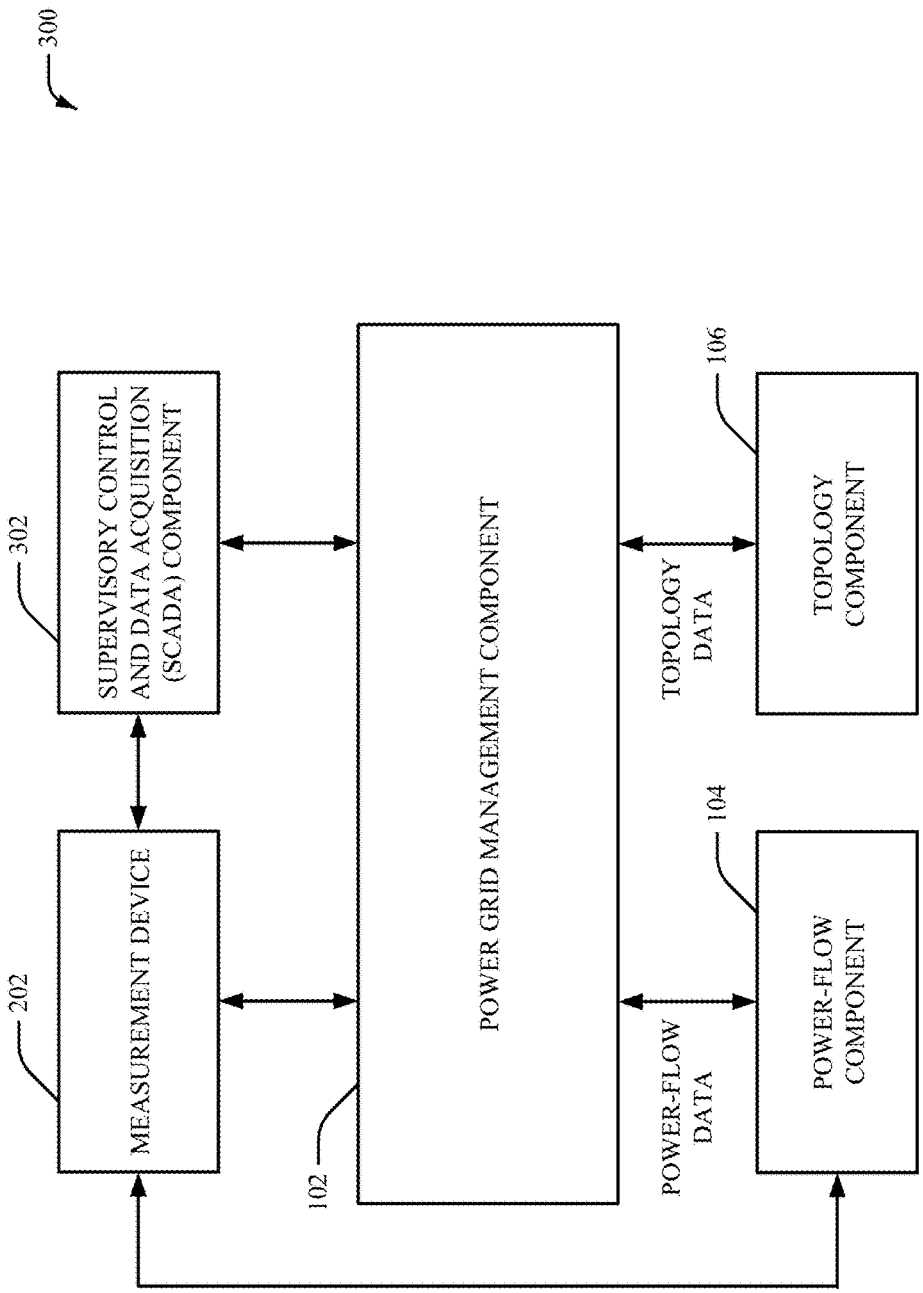
FIG. 3 illustrates yet another system that facilitates managing energy flow in a power grid system in accordance with aspects of the subject disclosure.

FIG. 3 is a diagram of an example system 300 in accordance with aspects of the subject disclosure. System 300 includes the power grid management component 102. Additionally, the system 300 can include the power-flow component 104, the topology component 106, the measurement device 202 and/or a supervisory control and data acquisition (SCADA) component 302. The SCADA component 302 can be associated with a system for monitoring and/or controlling devices in the power grid system. For example, the SCADA component 302 can provide real-time information (e.g., real-time information associated with the devices in the power grid system) and/or sensor information (e.g., sensor information associated with the devices in the power grid system) to the power grid management component 102. In an aspect, the SCADA component 302 can control automated processing of alarms in the power grid system, obtain and/or analyze measurement data (e.g., associated with the measurement device 202 and/or another measuring device) in the power grid system, monitor relay data associated with the power grid system, monitor oscillation data associated with the power grid system, manage limits (e.g., set point limits) associated with the power grid system, manage alarms and/or overloads associated with the power grid system, manage tagging data for equipment associated with the power grid system, manage archiving of data associated with the power grid system, manage faults associated with the power grid system (e.g., via a fault location isolation and service restoration (FLISR) system), monitor and/or study the power grid system, and/or manage other data associated with the power grid system. In another aspect, the SCADA component 302 can be associated with remote terminal units connected to sensors in the power grid system, programmable logic controllers connected to sensors in the power grid system and/or a communication system (e.g., a telemetry system) associated with the power grid system. In yet another aspect, the measurement device 202 and/or the SCADA component 302 can be real-time systems for providing real-time data (e.g., real-time data associated with devices, meters, sensors and/or other equipment in the power grid system) to the power grid management component 102. For example, the measurement device 202 and/or the SCADA component 302 can provide real-time measurement data, real-time operational data and/or real-time feedback data to the power grid management component 102.

In yet another aspect, the SCADA component 302 can manage events associated with the power grid system. The SCADA component 302 can also generate device state data associated with determined events and/or tracked events in the power grid system. Device state data generated by the SCADA component 302 can additionally be associated with a tag (e.g., an identifier) for a device in the power grid system. The SCADA component 302 can also obtain and/or analyze measurement data for a device in the power grid system, monitor relay data associated with the power grid system, monitor oscillation data associated with the power grid system, manage limits (e.g., set point limits) associated with the power grid system, manage alarms and/or overloads associated with the power grid system, archiving data associated with a device in the power grid system, manage faults associated with a device in the power grid system, etc. In example embodiments, data determined and/or generated by the SCADA component 302 can be employed by the power-flow component 104 and/or the topology component 106 to facilitate generation of the power-flow data and/or the topology data. Additionally or alternatively, data determined and/or generated by the SCADA component 302 can be employed by the power grid management component 102 to facilitate management of energy flow in the power grid stem.

Figure 4:
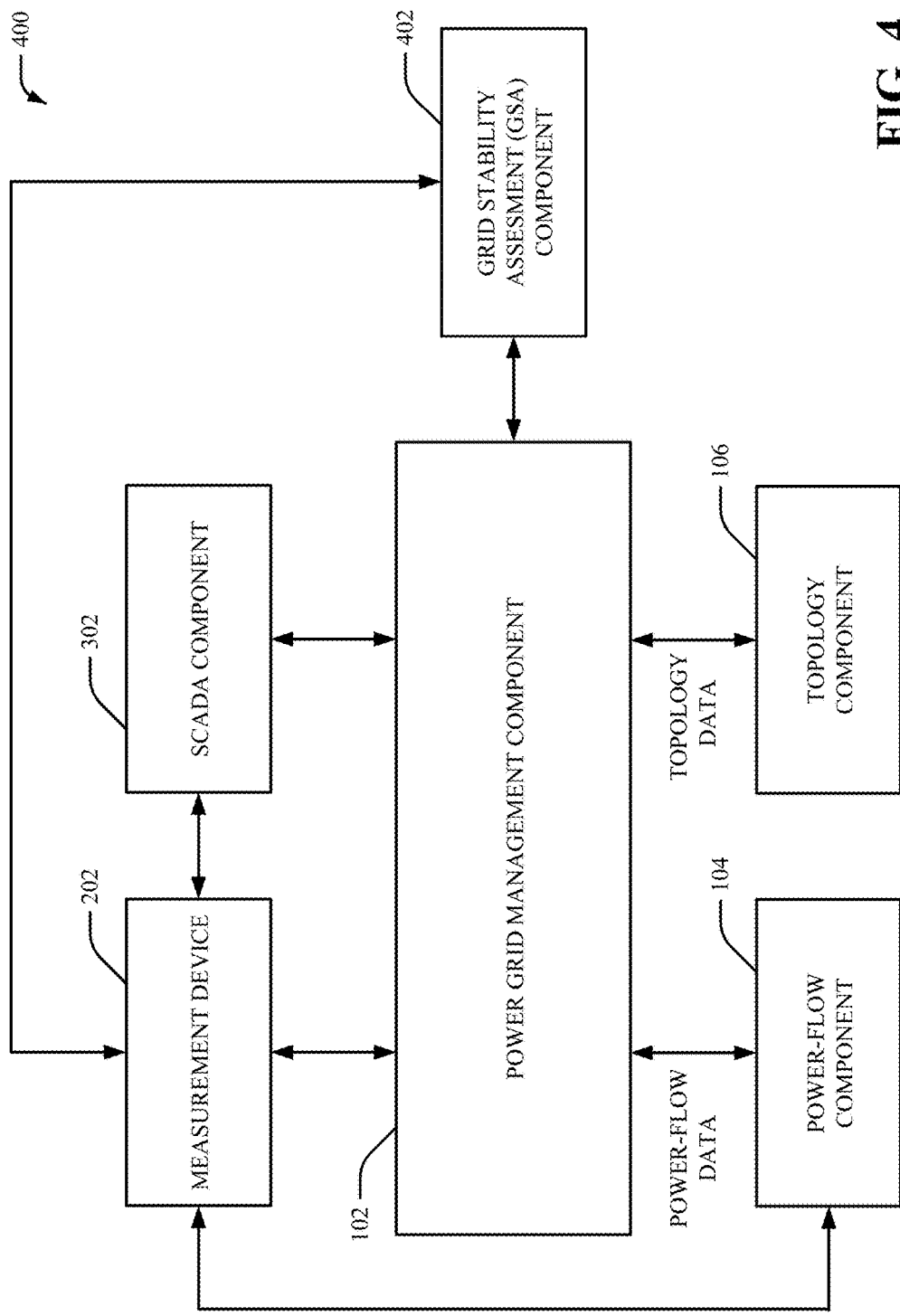
FIG. 4 illustrates yet another system that facilitates managing energy flow in a power grid system in accordance with aspects of the subject disclosure.

FIG. 4 is a diagram of an example system 400 in accordance with aspects of the subject disclosure. System 400 includes the power grid management component 102. Additionally, the system 400 can include the power-flow component 104, the topology component 106, the measurement device 202, the SCADA component 302 and/or a Grid Stability Assessment (GSA) component 402. In example embodiments, the GSA component 402 can include the power grid management component 102. The GSA component 402 can be associated with an energy management system for the power grid system, a situational awareness system for the power grid system, a visualization system for the power grid system, a monitoring system for the power grid system and/or a stability assessment system for the for the power grid system. The GSA component 402 can additionally provide real-time analytics based on measurements associated with the power grid system. For example, the GSA component 402 can process real-time data obtained from the measurement device 202 to determine dynamic behavior of the power grid system. In an aspect, the GSA component 402 can generate, determine and/or store a set of defined patterns for the power grid system. For example, the GSA component 402 can generate, determine and/or store different defined patterns for different locations of the power grid system. The set of defined patterns generated by the GSA component 402 can be, for example, a set of defined voltage patterns for the power grid system. Furthermore, a defined pattern from the set of defined patterns can be associated with a transmission line in the power grid system, a device in the power grid system, a sector of the power grid system and/or a corridor of the power grid system.

Figure 5:
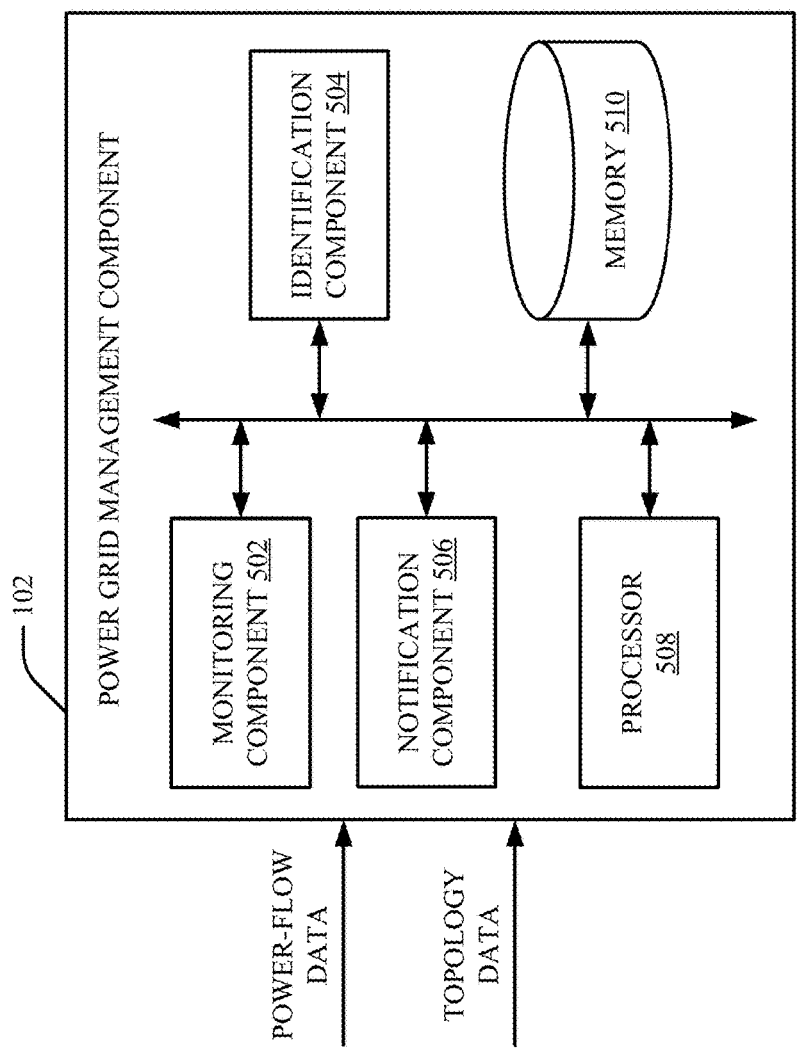
FIG. 5 is a high-level block diagram of an example power grid management component in accordance with aspects of the subject disclosure.

FIG. 5 is a diagram of an example power grid management component 102 in accordance with aspects of the subject disclosure. In FIG. 5, the power grid management component 102 includes a monitoring component 502, an identification component 504 and a notification component 506. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the power grid management component 102 can include memory 510 for storing computer executable components and instructions. The power grid management component 102 can further include a processor 508 to facilitate operation of the instructions (e.g., computer executable components and instructions) by the power grid management component 102.

The monitoring component 502 can generate monitoring data for a power grid system (e.g., an electrical energy distribution system) associated with the power grid management component 102. The monitoring component 502 can generate the monitoring data based on the power-flow data (e.g., the power-flow data provided by the power-flow component 104) and/or the topology data (e.g., the topology data provided by the topology component 106). The monitoring data can, for example, include at least the power-flow data and/or the topology data. In one example, the power-flow data and/or the topology data can be encoded in the monitoring data.

The identification component 504 can identify a change in the power-flow data. For example, based on the monitoring data, the identification component 504 can identify a change in a voltage angle associated with the power-flow data. The identification component 504 can also determine, based on the topology data, a location in the power grid system that is associated with the change in the voltage angle. In an example embodiment, the identification component 504 can identify a rate of change in the power-flow data. For example, based on the monitoring data, the identification component 504 can identify a rate of change in a voltage angle associated with the power-flow data. The identification component 504 can also determine, based on the topology data, a location in the power grid system that is associated with the rate of change in the voltage angle. A location in the power grid system that is determined by the identification component 504 can include, but is not limited to a particular transmission line in the power grid system, a particular device in the power grid system, a particular sector of the power grid system and/or a particular corridor of the power grid system that is associated with the change in the voltage angle. A location in the power grid system can also be associated with a geographic location (e.g., a GPS location, etc.).

The identification component 504 can identify a change in the power-flow data and/or a rate of change in the power-flow data based on a set of defined patterns for the power grid system. For example, different defined patterns for different locations of the power grid system can be generated and/or stored by the identification component 504 or another component (e.g., the SCADA component 302, the GSA component 402, etc.) in communication with the identification component. The set of defined patterns can be, for example, a set of defined voltage patterns for the power grid system. Furthermore, a defined voltage pattern from the set of defined voltage patterns can be associated with a transmission line in the power grid system, a device in the power grid system, a sector of the power grid system and/or a corridor of the power grid system.

Moreover, the identification component 504 can identify a change in the power-flow data and/or a rate of change in the power-flow data based on one or more power flow analysis techniques that analyze power flow in the power grid system. For example, the one or more power flow analysis techniques can analyze a portion of the power-flow data associated with a transmission line in the power grid system, a device in the power grid system, a sector of the power grid system and/or a corridor of the power grid system. In a non-limiting example, the identification component 504 can identify a change in the power-flow data and/or a rate of change in the power-flow data based on a FDPF technique. The one or more power flow analysis techniques employed by the identification component 504 can, for example, compare the power-flow data to the set of defined patterns. Accordingly, the identification component 504 can identify, a change in the power-flow data and/or a rate of change in the power-flow data, a power outage associated with the power grid system and/or congestion associated with the power grid system.

In an aspect, the identification component 504 can concurrently identify different changes and/or different rate of changes (e.g., different changes in voltage angles and/or different rate of changes in voltage angles) in the power grid system based on the power-flow data. For example, the identification component 504 can identify a first change and/or a first rate of change associated with a transmission line of the power grid system based on the power-flow data. At approximately a corresponding instance in time (e.g., for a time-stamp that at least approximately corresponds to a time-stamp associated with the first change and/or the first rate of change), the identification component 504 can additionally identify a second change and/or a second rate of change associated with another transmission line of the power grid system, a device of the power grid system, a sector of the power grid system and/or a corridor of the power grid system based on the power-flow data. As such, the identification component 504 can identify other change(s) in other voltage angle(s) for a device associated with a transmission line, a transmission line of the power grid system, a sector of the power grid system and/or a corridor of the power grid system based on the power-flow data.

In yet another aspect, the monitoring component 502 can repeatedly obtain the power-flow data and/or the topology data during a first period of time. Furthermore, the identification component 504 can identify a change in the power-flow data and/or a rate of change in the power-flow data during a second period of time. For example, the identification component 504 can identify a change in the power-flow data and/or a rate of change in the power-flow data based on historical data (e.g., historical power-flow data stored in a data store) that is obtained prior to obtaining the power-flow data. In another example, the identification component 504 can identify a change in the power-flow data and/or a rate of change in the power-flow data based on a subset of the power-flow data (e.g., a subset of the power-flow data that is associated with a short period of time than the power-flow data currently obtained by the monitoring component 502).

The notification component 506 can generate a notification for a graphical user interface in response to a determination that a change in the power-flow data and/or a rate of change in the power-flow data satisfies a defined criterion. For example, the notification component 506 can generate a notification for a graphical user interface in response to a determination that a change in the voltage angle associated with the power-flow data a satisfies a defined criterion and/or a determination that a rate of change in a voltage angle associated with the power-flow data satisfies a defined criterion. In an aspect, the notification component 506 can modify a portion of a graphical user interface in response to a determination that a change in the power-flow data and/or a rate of change in the power-flow data satisfies a defined criterion. The defined criterion can be, for example, that a change in the power-flow data and/or a rate of change in the power-flow data corresponds to a power outage in the power grid system. In another example, the defined criterion can be that a change in the power-flow data and/or a rate of change in the power-flow data corresponds to abnormal energy flow in the power grid system. In yet another example, the defined criterion can be that a change in the power-flow data and/or a rate of change in the power-flow data corresponds to condition in the power grid system where an amount of a power supply to a device of the power grid system is below a defined threshold level. In yet another example, the defined criterion can be that a change in the power-flow data and/or a rate of change in the power-flow data corresponds to a violation with respect to defined voltage angle separation limits. In yet another example, the defined criterion can be that a change in the power-flow data and/or a rate of change in the power-flow data corresponds to a defined congestion level associated with the power grid system.

In example embodiments, the notification component 506 can generate information related to a set of actions for modifying a portion of the power grid system in response to a determination that a change in the power-flow data and/or a rate of change in the power-flow data satisfies a defined criterion. For example, the set of action can be a set of steps to perform with respect to modifying a portion of the power grid system. The set of actions can facilitate a recovery of the power grid system in response a change in the power-flow data and/or a rate of change in the power-flow data that satisfies a defined criterion. Additionally or alternatively, the notification component 506 can generate information related to a power outage in the power grid system and/or congestion associated with the power grid system in response to a determination that a change in the power-flow data and/or a rate of change in the power-flow data satisfies a defined criterion.

While FIGS. 1-5 depict separate components in system 100, 200, 300, 400 and 500, it is to be appreciated that the components may be implemented in a common component. Further, it can be appreciated that the design of system 100, 200, 300, 400 and/or 500 can include other component selections, component placements, etc., to facilitate management of a power grid system (e.g., an electrical energy distribution system).

Figure 6:
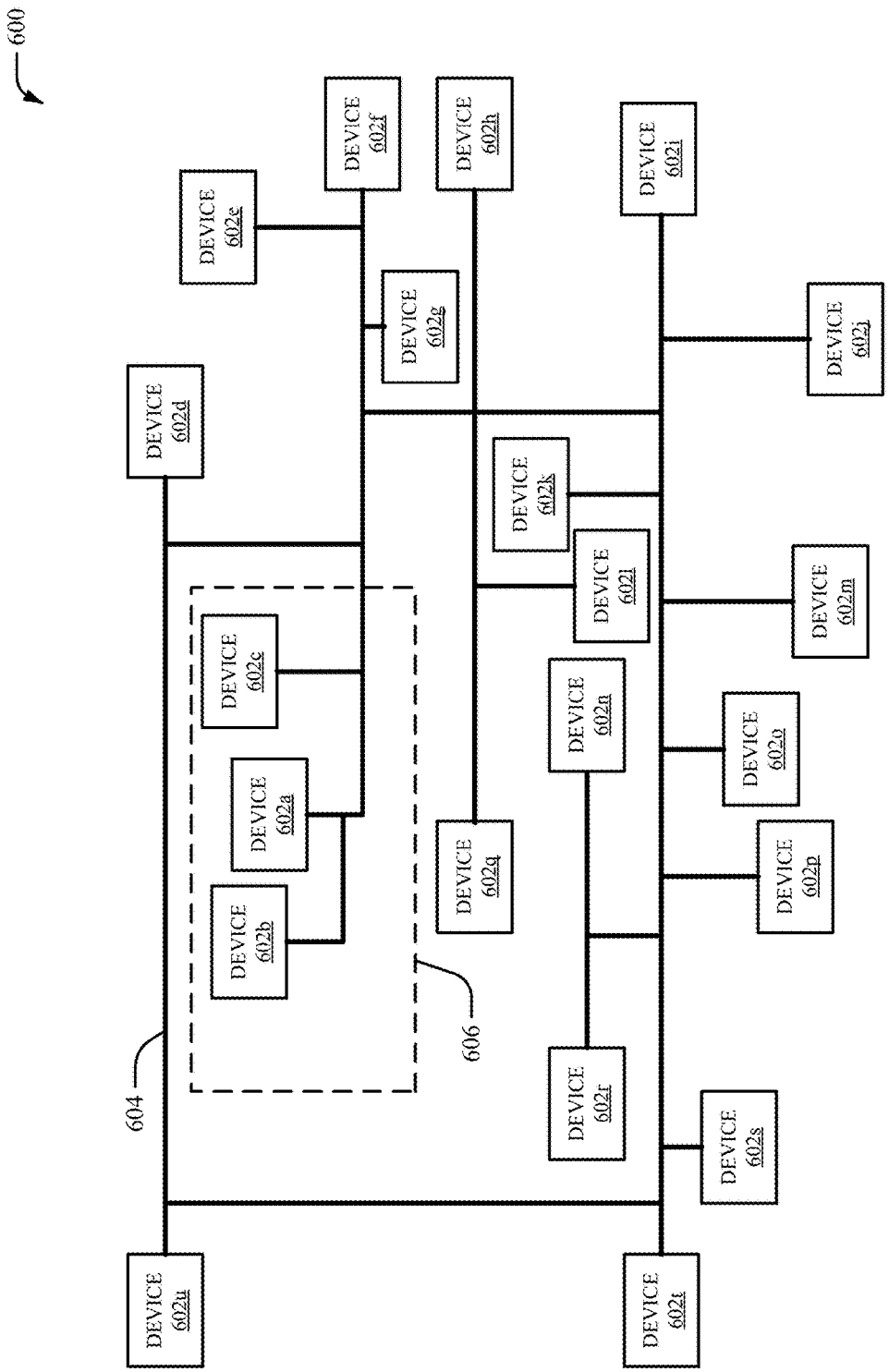
FIG. 6 illustrates an example power grid system in accordance with aspects of the subject disclosure.

FIG. 6 illustrates a power grid system 600 in accordance with aspects of the subject disclosure. The power grid system 600 can be, for example, a power grid system associated with the power grid management component 102. The power grid system 600 includes devices 602a-u. It is to be appreciated that a number of devices shown in the power grid system 600 is merely an example. Therefore, a power grid system associated with the power grid management component 102 can include a different number of device (e.g., a greater number of devices, less number of devices, etc.). The devices 602a-u can be coupled via a network of transmission lines. For example, device 602u and device 602d can be coupled via a transmission line 604 from a network of transmission lines associated with the devices 602a-u. Furthermore, a subset of the devices 602a-u can be associated with a sector of the power grid system 600. For example, a sector 606 of the power grid system 600 can include device 602a, device 602b and device 602c. In one example, the sector 606 can be a corridor of the power grid system 600.

In a non-limiting example, the power-flow data provided by the power-flow component 104 and/or the topology data provided by the topology component 106 can be associated with a power grid system such as, for example, the power grid system 600. For example, the power-flow data provided by the power-flow component 104 and/or the topology data provided by the topology component 106 can be associated with at least one device from the devices 602a-u. In another example, the power-flow data provided by the power-flow component 104 and/or the topology data provided by the topology component 106 can be associated with the transmission line 604 and/or one or more other transmission lines in the power grid system 600. In yet another example, the power-flow data provided by the power-flow component 104 and/or the topology data provided by the topology component 106 can be associated with the sector 606 and/or one or more other sectors in the power grid system 600.

Figure 7:
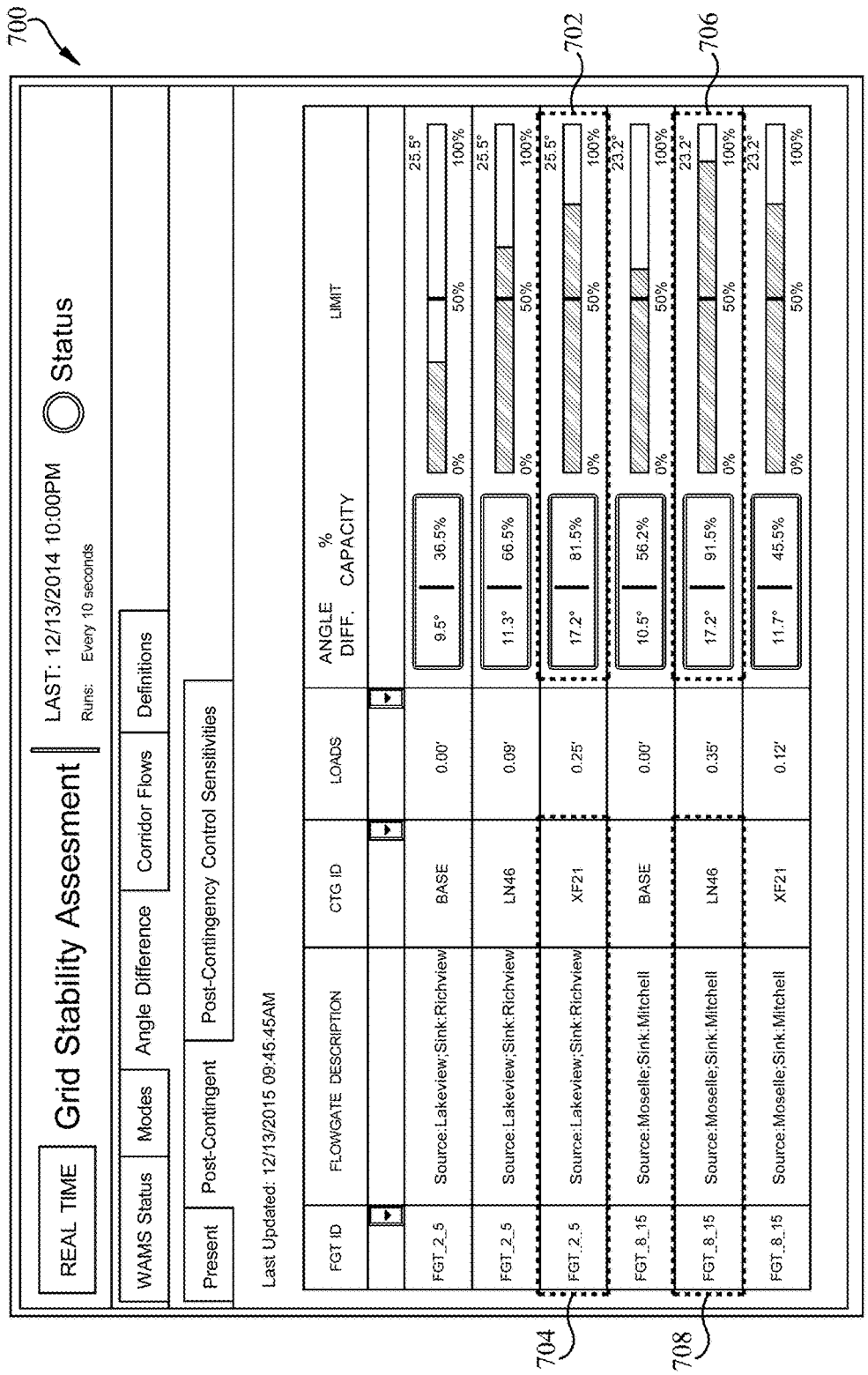
FIGS. 7-10 illustrate example graphic user interfaces in accordance with aspects of the subject disclosure.

FIG. 7 illustrates a graphical user interface 700 in accordance with aspects of the subject disclosure. For example, the graphical user interface 700 can be generated by and/or associated with the notification component 506. Furthermore, the graphical user interface 700 can be associated with a display of a device (e.g., a computing device). A device associated with the graphical user interface 700 can include, for example, a computer, a laptop computer, a mobile device, a handheld device, a cellular phone (e.g., a smartphone), a tablet device, an interactive monitor, another type of device capable of displaying and/or presenting a graphical user interface, etc. The graphical user interface 700 can provide various information regarding a status of a power grid system. In an aspect, the 700 can present one or more notifications regarding stability of a power grid system and/or energy flow in a power grid system. For example, a notification 702 can provide power-flow data related to topology data 704. The notification 702 can include an angle difference measurement, a capacity percentage calculation and/or a limit reading associated with topology data 704. The topology data 704 can be associated with a first location in a power grid system (e.g., a source location in a power grid system) and a second location in a power grid system (e.g., a sink location in a power grid system). Content of the notification 702 can be varied (e.g., modified) based on the angle difference measurement, the capacity percentage calculation and/or the limit reading associated with topology data 704. For example, values of the angle difference measurement, the capacity percentage calculation and/or the limit reading can be varied. Additionally or alternatively, visual characteristics of the notification 702 can be varied (e.g., modified) based on values of the angle difference measurement, the capacity percentage calculation and/or the limit reading.

Similarly, a notification 706 can provide power-flow data related to topology data 708. The topology data 708 can be related to a different location in a power grid system than the topology data 704. The notification 706 can include an angle difference measurement, a capacity percentage calculation and/or a limit reading associated with topology data 708. The topology data 708 can be associated with a third location in the power grid system (e.g., a source location in a power grid system) and a fourth location in the power grid system (e.g., a sink location in a power grid system). Content of the notification 706 can be varied (e.g., modified) based on the angle difference measurement, the capacity percentage calculation and/or the limit reading associated with topology data 708. For example, values of the angle difference measurement, the capacity percentage calculation and/or the limit reading can be varied. Additionally or alternatively, visual characteristics of the notification 706 can be varied (e.g., modified) based on values of the angle difference measurement, the capacity percentage calculation and/or the limit reading.

Figure 8:
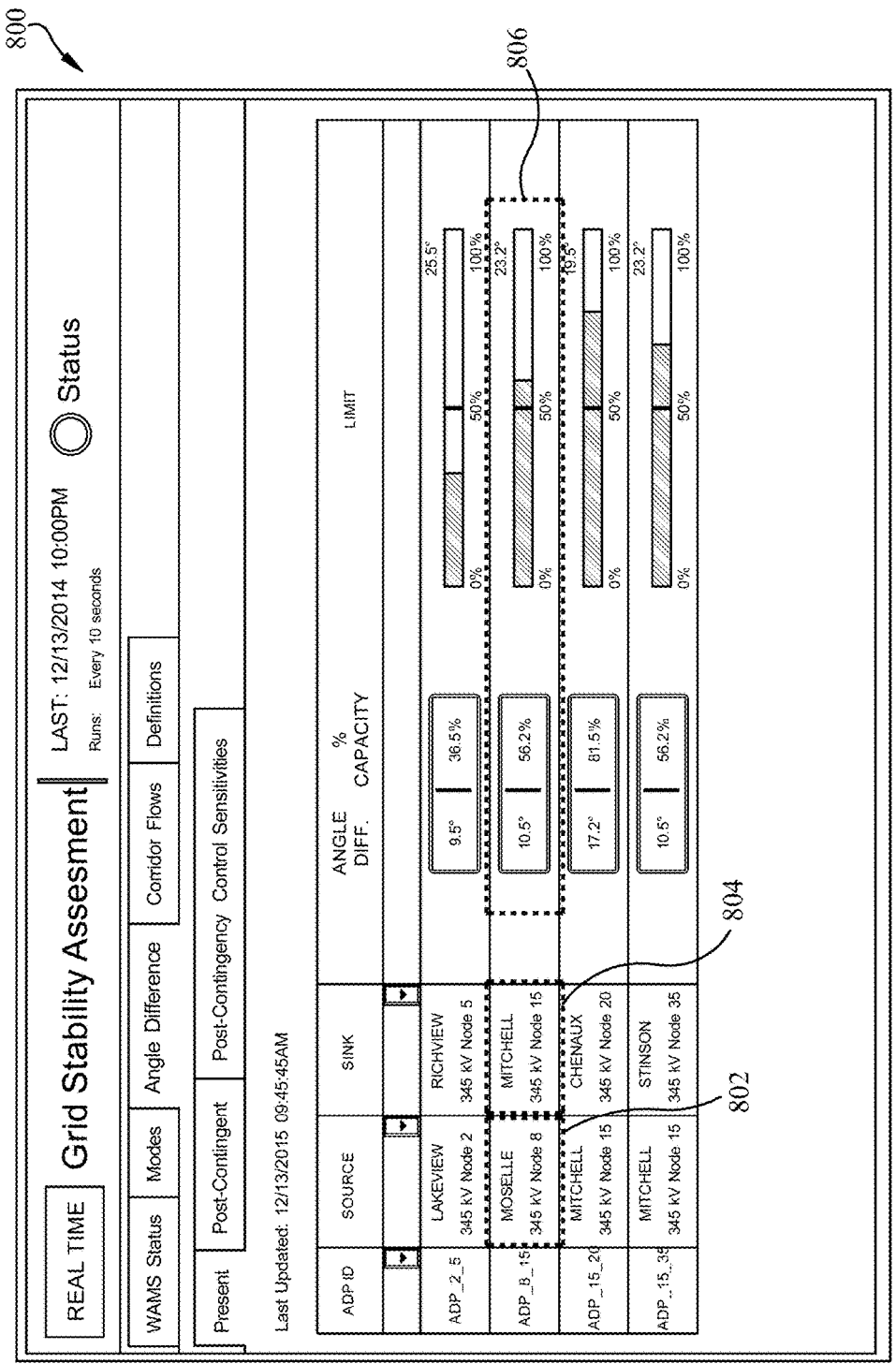

FIG. 8 illustrates a graphical user interface 800 in accordance with aspects of the subject disclosure. For example, the graphical user interface 800 can be generated by and/or associated with the notification component 506. Furthermore, the graphical user interface 800 can be associated with a display of a device (e.g., a computing device). A device associated with the graphical user interface 800 can include, for example, a computer, a laptop computer, a mobile device, a handheld device, a cellular phone (e.g., a smartphone), a tablet device, an interactive monitor, another type of device capable of displaying and/or presenting a graphical user interface, etc. With the graphical user interface 800, a user can select a first location 802 (e.g., a source location, a first node, a first geographic location, etc.) and a second location 804 (e.g., a sink location, a second node, a second geographic location, etc.) in a power grid system. In response to selection of the first location 802 and the second location 804 via the graphical user interface 800, monitoring data (e.g., power-flow data and/or topology data) can be generated (e.g., by the monitoring component 502). Additionally, in response to selection of the first location 802 and the second location 804 via the graphical user interface 800, a change in a voltage angle (e.g., a voltage angle difference) associated with the first location 802 and the second location 804 can be identified (e.g., by the identification component 504). Furthermore, a notification 806 can be generated (e.g., by the notification component 506) that includes at least a determined voltage angle (e.g., a voltage angle difference) associated with the first location 802 and the second location 804. Visual characteristics and/or content of the notification 806 can be varied as a function of the determined voltage angle (e.g., a voltage angle difference) associated with the first location 802 and the second location 804. For example, a color of the notification 806 can be varied as a function of the determined voltage angle (e.g., a voltage angle difference) associated with the first location 802 and the second location 804.

Figure 9:
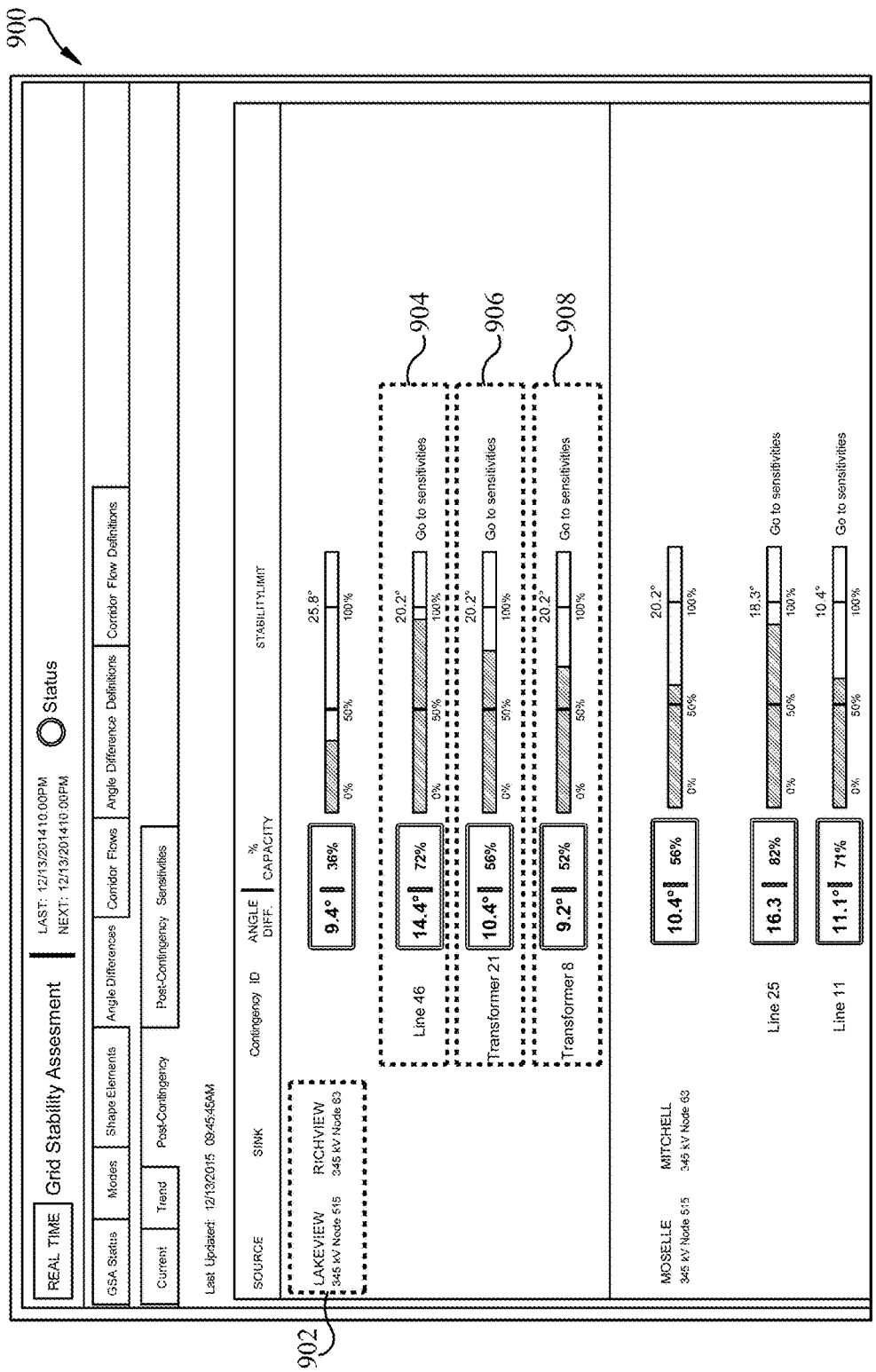

FIG. 9 illustrates a graphical user interface 900 in accordance with aspects of the subject disclosure. For example, the graphical user interface 900 can be generated by and/or associated with the notification component 506. Furthermore, the graphical user interface 900 can be associated with a display of a device (e.g., a computing device). A device associated with the graphical user interface 900 can include, for example, a computer, a laptop computer, a mobile device, a handheld device, a cellular phone (e.g., a smartphone), a tablet device, an interactive monitor, another type of device capable of displaying and/or presenting a graphical user interface, etc. The graphical user interface 900 can present multiple notifications for a particular location in a power grid system associated with topology data 902. For example, the topology data 902 can be associated with a first location (e.g., a source location, a first node, a first geographic location, etc.) and a second location (e.g., a sink location, a second node, a second geographic location, etc.) in a power grid system. A first notification 904 can provide power-flow data and/or a change in a voltage angle for a transmission line associated with the topology data 902 (e.g., a transmission line between the first location and the second location associated with the topology data 902). A second notification 906 can provide power-flow data and/or a change in a voltage angle for a first device (e.g., a first transformer device) associated with the topology data 902 (e.g., a first device located at the first location or the second location associated with the topology data 902). A third notification 908 can provide power-flow data and/or a change in a voltage angle for a second device (e.g., a second transformer device) associated with the topology data 902 (e.g., a second device located at the first location or the second location associated with the topology data 902).

Figure 10:
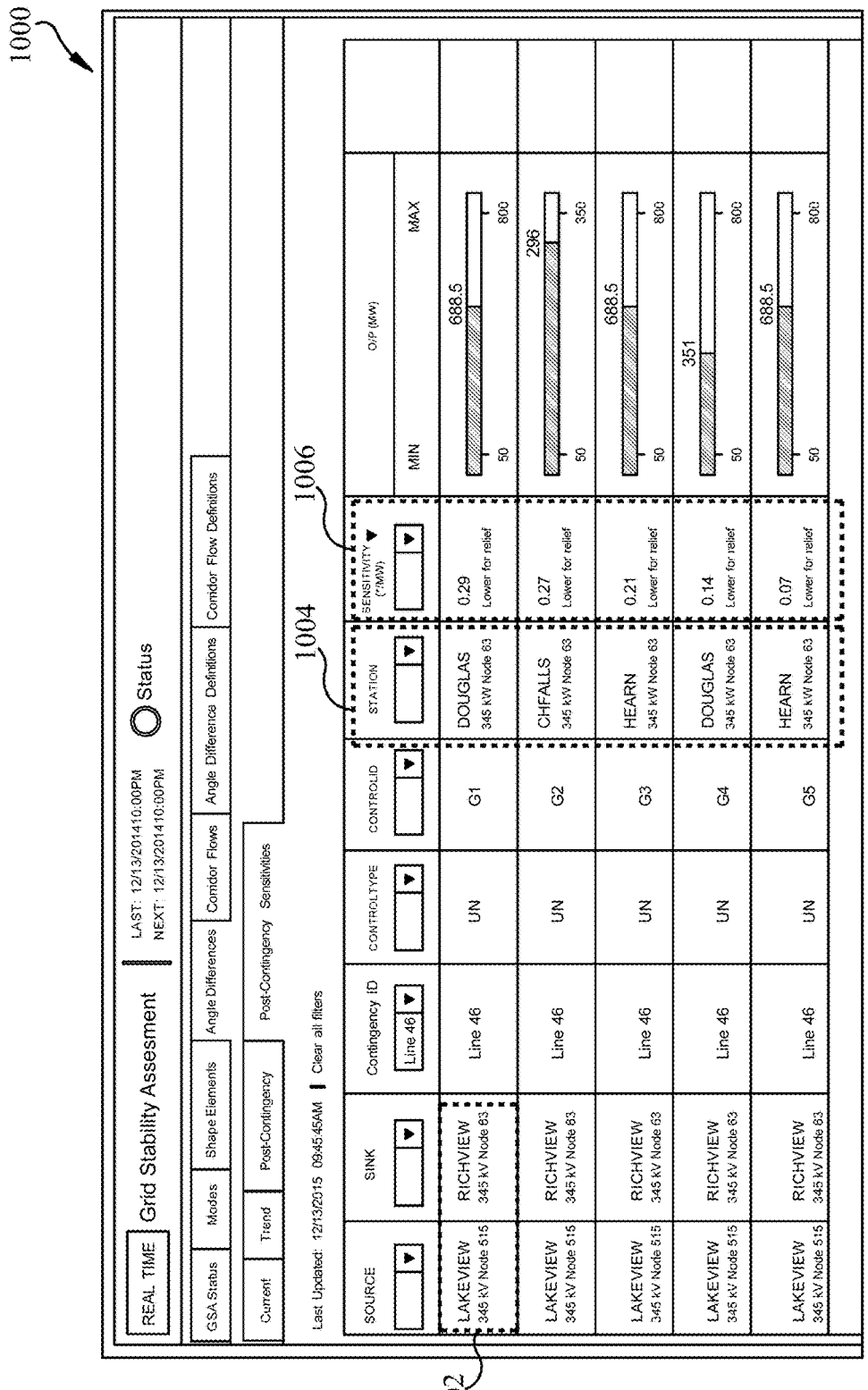

FIG. 10 illustrates a graphical user interface 1000 in accordance with aspects of the subject disclosure. For example, the graphical user interface 1000 can be generated by and/or associated with the notification component 506. Furthermore, the graphical user interface 1000 can be associated with a display of a device (e.g., a computing device). A device associated with the graphical user interface 1000 can include, for example, a computer, a laptop computer, a mobile device, a handheld device, a cellular phone (e.g., a smartphone), a tablet device, an interactive monitor, another type of device capable of displaying and/or presenting a graphical user interface, etc. The graphical user interface 1000 can present different voltage sensitivities for a different locations in a power grid system with respect to power-flow data associated with topology data 1002. The topology data 1002 can be associated with a first location (e.g., a source location, a first node, a first geographic location, etc.) and a second location (e.g., a sink location, a second node, a second geographic location, etc.) in a power grid system. Furthermore, graphical element 1004 can include different locations in the power grid system (e.g., different power grid stations) that measure voltage characteristics (e.g., feedback data, voltage sensitivities, etc.) associated with the topology data 1002. Graphical element 1006 can include different voltage sensitivities corresponding to the different locations associated with the graphical element 1004. As such, real-time voltage sensitivities of a power grid system can be determined and/or analyzed at different locations throughout the power grid system.

Figure 11:
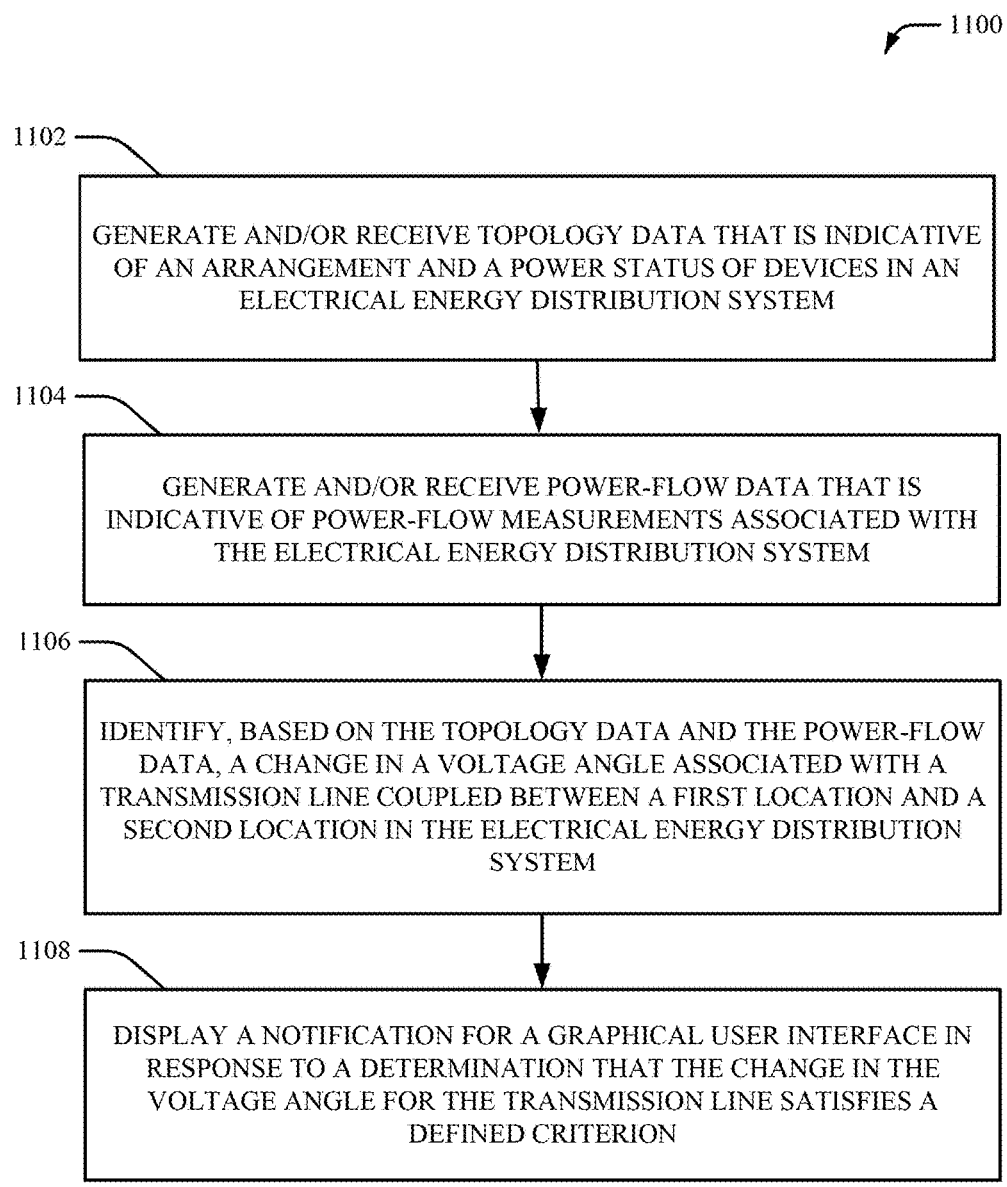
FIG. 11 illustrates a method for managing energy flow in a power grid system in accordance with aspects of the subject disclosure.

In view of the example system(s) described above, example method(s) that can be implemented in accordance with the disclosed subject matter can be better appreciated with reference to flowcharts in FIG. 11. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 11 illustrates a methodology 1100 for managing energy flow in an electrical energy distribution system (e.g., a power grid system), according to an aspect of the subject innovation. At 1102, topology data that is indicative of an arrangement and a power status of devices in an electrical energy distribution system is generated (e.g., by a topology component 106) and/or received (e.g., by a monitoring component 502). The topology data can be generated, for example, based on connectivity data indicative of a connectivity status for the devices. Additionally or alternatively, the topology data can be generated based on switching data indicative information for switching operations associated with the devices (e.g., a status for the switching operations, etc.). In example embodiments, the topology data can also be generated based on power data indicative of a power state of the devices, device state data indicative of a state of the devices, meter data indicative of meter readings associated with the devices, report data indicative of a report generated for the electrical energy distribution system and/or call data indicative of information provided by user identities via phone calls. In an aspect, the topology data can be generated based on encoded data (e.g., encoded feedback data) provided by the devices. In another aspect, the topology data can be generated based on a location of the devices with respect to other devices in the electrical energy distribution system.

At 1104, power-flow data that is indicative of power-flow measurements associated with the electrical energy distribution system is generated (e.g., by a power-flow component 104) and/or received (e.g., by a monitoring component 502). For example, the power-flow data can be associated with voltage parameters (e.g., voltage measurements) and/or current parameters (e.g., current measurements). In an aspect, the power-flow data can be indicative of power-flow measurements that are repeatedly obtained from the electrical energy distribution system. For example, the power-flow data can be indicative of a set of voltage values (e.g., a set of measured voltage values) that are repeatedly obtained from the electrical energy distribution system. Furthermore, in one example, the power-flow data can be phasor data (e.g., phasor voltage data) obtained via a measurement device (e.g., a phasor measurement device). The power-flow data can also be time-tagged and/or location-tagged. In another aspect, the power-flow component 104 can be associated with a set of meters (e.g., smart meters, meter equipment, etc.) and/or communication networks associated with the electrical energy distribution system. For example, each meter from the set of meters can determine consumption of power (e.g., electric energy) during a certain period of time (e.g., during an hour interval, during a 30 minute interval, etc.), automatic meter readings and/or real-time meter readings.

At 1106, a change in a voltage angle associated with a transmission line coupled between a first location and a second location in the electrical energy distribution system is identified (e.g., by an identification component 504) based on the topology data and the power-flow data. Additionally or alternatively, a change in a voltage angle associated with a device located at the first location and/or the second location can be identified based on the topology data and the power-flow data. In an aspect, a rate of the change in the voltage angle associated with the transmission line and/or the device(s) can be identified. In another aspect, the change in the voltage angle associated with the transmission line and/or the device(s) can be identified based on defined voltage patterns for the electrical energy distribution system. The defined voltage patterns can be generated and/or employed for various portions of the electrical energy distribution system. For example, the defined voltage pattern can be associated with the transmission line and/or the device. Additionally or alternatively, the change in the voltage angle associated with the transmission line and/or the device can be identified based on a power flow technique that analyzes power flow associated with the electrical energy distribution system. In one example, the power flow technique can be a FDPF technique.

At 1108, a notification for a graphical user interface is displayed (e.g., by a notification component 506) in response to a determination that the change in the voltage angle for the transmission line satisfies a defined criterion. Additionally or alternatively, the notification for the graphical user interface can be displayed (in response to a determination that the change in the voltage angle for the device satisfies a defined criterion. For example, the notification for the graphical user interface can be displayed in response to a determination that the change in the voltage angle for the transmission line and/or the device satisfies a defined threshold level. Additionally or alternatively, the notification for the graphical user interface can be displayed in response to user input data provided to the graphical user interface (e.g. a request by a user for the voltage angle). In an aspect, a portion of the graphical user interface can be modified in response to the determination that the change in the voltage angle for the transmission line and/or the device(s) satisfies the defined criterion. For example, a color for a notification associated with the voltage angle can be modified (e.g., a notification can be configured with a red color in response to a determination that the change in the voltage angle for the transmission line and/or the device(s) satisfies the defined criterion).

Figure 12:
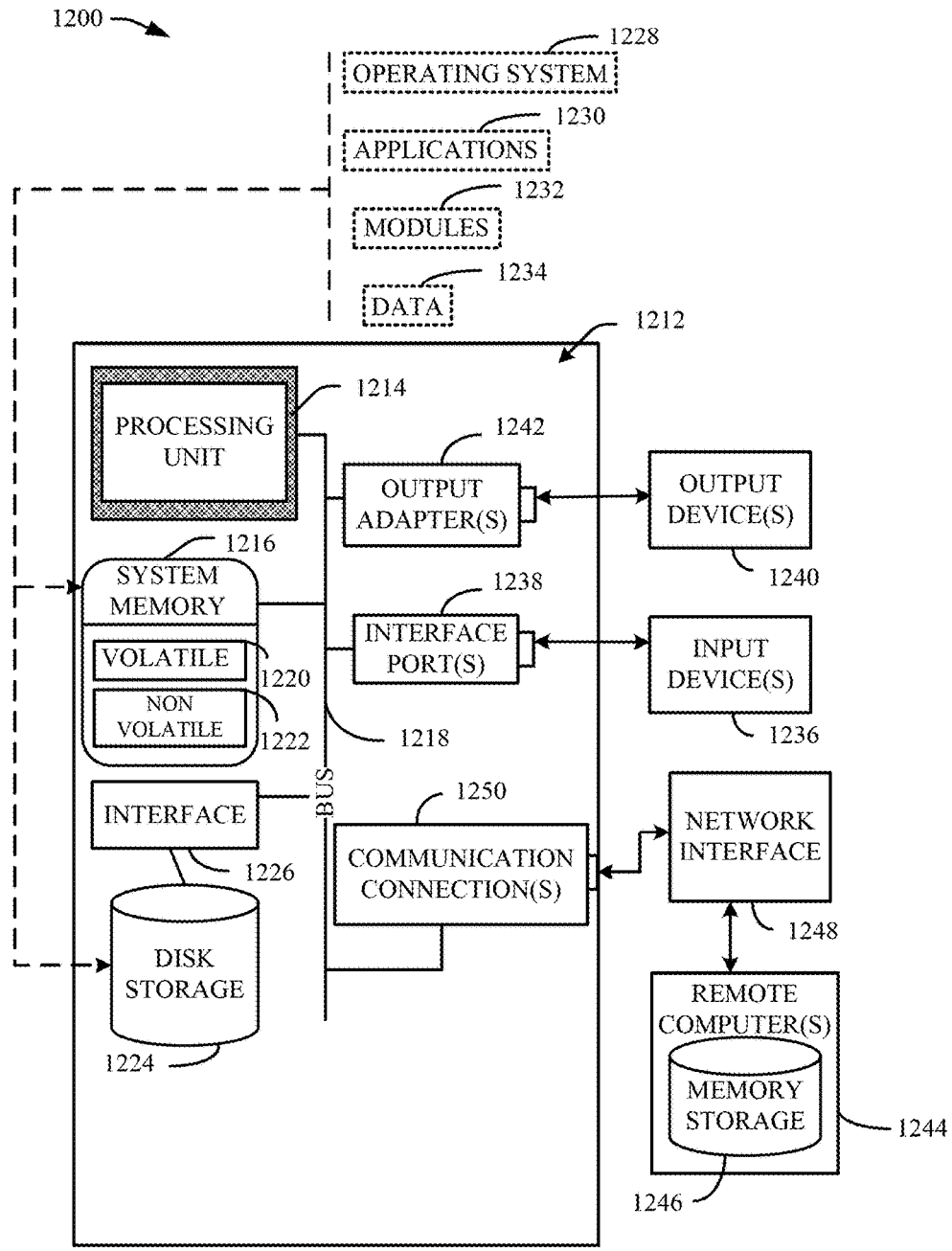
FIG. 12 is a schematic block diagram illustrating a suitable operating environment.

In order to provide a context for the various aspects of the disclosed subject matter, FIG. 12, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and nonvolatile memory, by way of illustration, and not limitation, volatile memory 1220 (see below), non-volatile memory 1222 (see below), disk storage 1224 (see below), and memory storage 1246 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 12 illustrates a block diagram of a computing system 1200 operable to execute the disclosed systems and methods in accordance with an embodiment. Computer 1212 includes a processing unit 1214, a system memory 1216, and a system bus 1218. System bus 1218 couples system components including, but not limited to, system memory 1216 to processing unit 1214. Processing unit 1214 can be any of various available processors. Dual microprocessors and other multiprocessor architectures also can be employed as processing unit 1214.

System bus 1218 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1394), and small computer systems interface.

System memory 1216 can include volatile memory 1220 and nonvolatile memory 1222. A basic input/output system, containing routines to transfer information between elements within computer 1212, such as during start-up, can be stored in nonvolatile memory 1222. By way of illustration, and not limitation, nonvolatile memory 1222 can include read only memory, programmable read only memory, electrically programmable read only memory, electrically erasable read only memory, or flash memory. Volatile memory 1220 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1212 can also include removable/non-removable, volatile/non-volatile computer storage media. FIG. 12 illustrates, for example, disk storage 1224. Disk storage 1224 includes, but is not limited to, devices like a magnetic disk drive, floppy disk drive, tape drive, flash memory card, or memory stick. In addition, disk storage 1224 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1224 to system bus 1218, a removable or non-removable interface is typically used, such as interface 1226.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 12 describes software that acts as an intermediary between users and computer resources described in suitable operating environment 1200. Such software includes an operating system 1228. Operating system 1228, which can be stored on disk storage 1224, acts to control and allocate resources of computer system 1212. System applications 1230 take advantage of the management of resources by operating system 1228 through program modules 1232 and program data 1234 stored either in system memory 1216 or on disk storage 1224. It is to be noted that the disclosed subject matter can be implemented with various operating systems or combinations of operating systems.

A user can enter commands or information into computer 1212 through input device(s) 1236. As an example, a user interface can be embodied in a touch sensitive display panel allowing a user to interact with computer 1212. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1214 through system bus 1218 by way of interface port(s) 1238. Interface port(s) 1238 include, for example, a serial port, a parallel port, a game port, a universal serial bus, an infrared port, a Bluetooth port, an IP port, or a logical port associated with a wireless service, etc. Output device(s) 1240 use some of the same type of ports as input device(s) 1236.

Thus, for example, a universal serial busport can be used to provide input to computer 1212 and to output information from computer 1212 to an output device 1240. Output adapter 1242 is provided to illustrate that there are some output devices 1240 like monitors, speakers, and printers, among other output devices 1240, which use special adapters. Output adapters 1242 include, by way of illustration and not limitation, video and sound cards that provide means of connection between output device 1240 and system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. Remote computer(s) 1244 can be a personal computer, a server, a router, a network PC, cloud storage, cloud service, a workstation, a microprocessor based appliance, a peer device, or other common network node and the like, and typically includes many or all of the elements described relative to computer 1212.

For purposes of brevity, only a memory storage device 1246 is illustrated with remote computer(s) 1244. Remote computer(s) 1244 is logically connected to computer 1212 through a network interface 1248 and then physically connected by way of communication connection 1250. Network interface 1248 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1250 refer(s) to hardware/software employed to connect network interface 1248 to bus 1218. While communication connection 1250 is shown for illustrative clarity inside computer 1212, it can also be external to computer 1212. The hardware/software for connection to network interface 1248 can include, for example, internal and external technologies such as modems, including regular telephone grade modems, cable modems and digital subscriber line modems, integrated services digital network adapters, and Ethernet cards.

Figure 13:
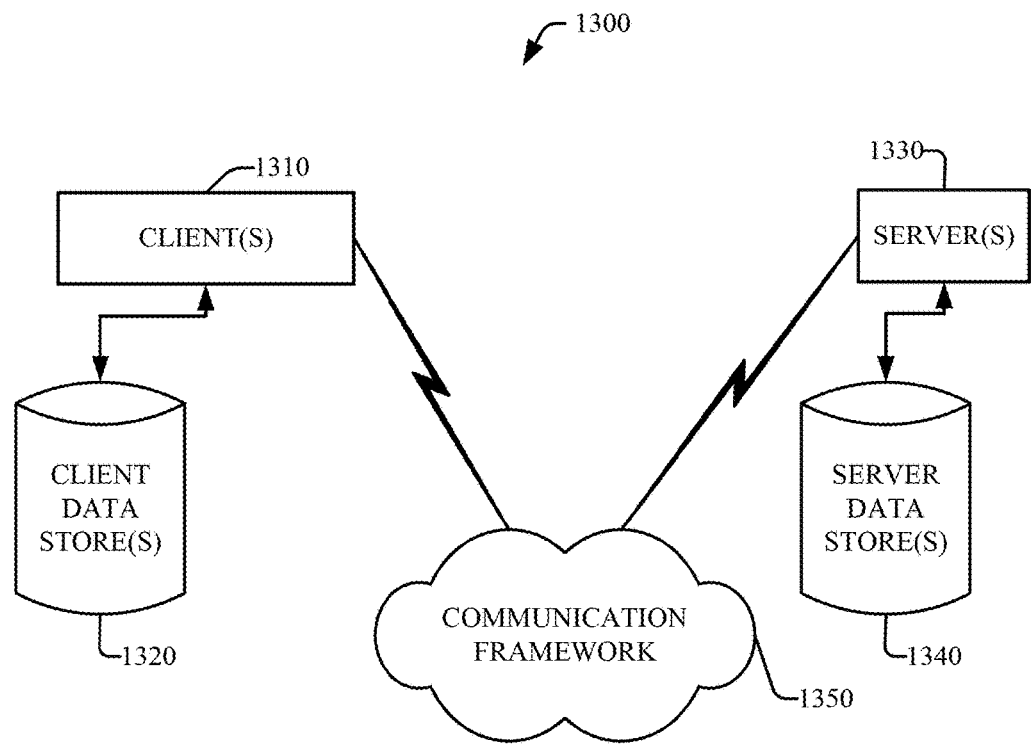
FIG. 13 is a schematic block diagram of a sample-computing environment.

FIG. 13 is a schematic block diagram of a sample-computing environment 1300 with which the subject matter of this disclosure can interact. The system 1300 includes one or more client(s) 1310. The client(s) 1310 can be hardware and/or software (e.g., threads, processes, computing devices). The system 1300 also includes one or more server(s) 1330. Thus, system 1300 can correspond to a two-tier client server model or a multi-tier model (e.g., client, middle tier server, data server), amongst other models. The server(s) 1330 can also be hardware and/or software (e.g., threads, processes, computing devices). The servers 1330 can house threads to perform transformations by employing this disclosure, for example. One possible communication between a client 1310 and a server 1330 may be in the form of a data packet transmitted between two or more computer processes.

The system 1300 includes a communication framework 1350 that can be employed to facilitate communications between the client(s) 1310 and the server(s) 1330. The client(s) 1310 are operatively connected to one or more client data store(s) 1320 that can be employed to store information local to the client(s) 1310. Similarly, the server(s) 1330 are operatively connected to one or more server data store(s) 1340 that can be employed to store information local to the servers 1330.

Figure 14:
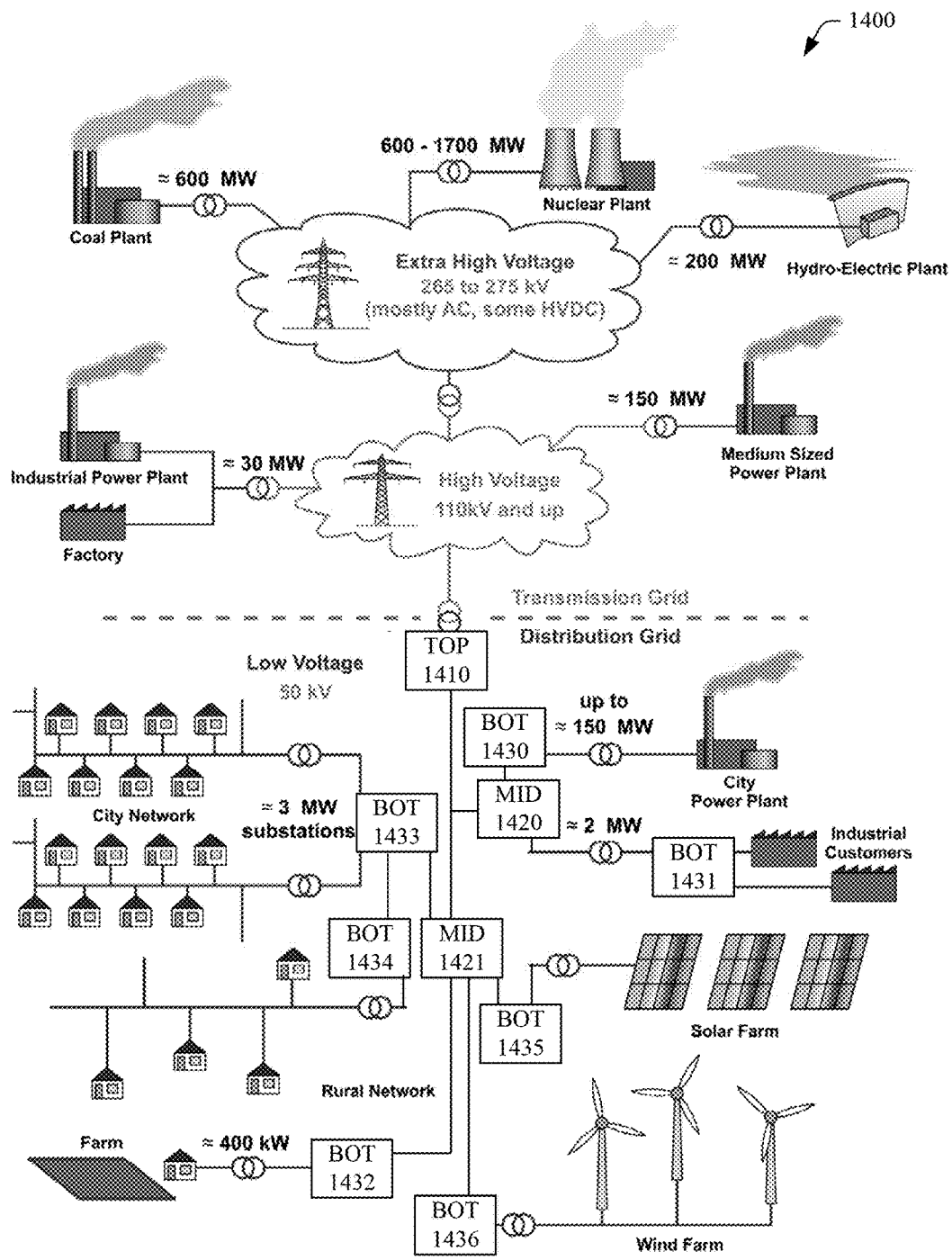
FIG. 14 depicts a diagram of an example electrical grid environment in which the various aspects of the disclosed subject matter can be practiced.

FIG. 14 depicts a diagram of an example electrical grid environment 1400 in which the various aspects of the disclosed subject matter can be practiced. It is to be appreciated that this figure and the associated disclosure is presented as a non-limiting example to facilitate a general comprehension of one or more aspects of the disclosed subject matter in connection with hypothetical electrical grid assets. Further, while sample values and assets are illustrated for context, these same sample values and assets are non-limiting and should not be viewed as defining any narrowing of scope. Generally, the assets of FIG. 14 can be assigned to a transmission grid portion (upper portion of figure) or a distribution grid portion (lower portion of figure) as is typical in many electrical power grids worldwide. Transmission systems often are associated with very high AC voltages or even DC transmission of power. Transmission systems are generally presented in the context of delivering high power to regional distribution networks managed by a distribution grid entity.

The conventional electrical distribution grid, as disclosed herein, generally has a flat control structure with control being centralized in a distribution control center (DCC). In contrast, as illustrated in FIG. 14, a non-flat control topography can be employed in accord with the subject matter disclosed herein. In this non-limiting example, three tiers of electrical distribution control system components are illustrated. A top-level (e.g., upper level) control node 1410 (also referred to as TOP 1410) (e.g., comprising a top-level DNNC component and top-level PSBC) can be communicatively coupled to junior level control nodes (e.g., 1420 to 1436), which can comprise junior level DNNC components and junior level PSBCs. In FIG. 14, the interconnections illustrate a basic tree structure topology.

In an aspect, two mid-level control nodes 1420 (also referred to as MID 1420) and 1421 (also referred to as MID 1421) can be logically placed between the bottom-level (e.g., lower level) control node and the top-level control node 1410. Further, the several bottom-level control nodes, such as bottom-level control nodes 1430 through 1436 (also referred to as BOT 1430 through BOT 1436), can be associated with various edge assets. For example, bottom-level control node 1430 can be associated with a city power plant and bottom-level control node 1431 can be associated with a small group of industrial customers. Bottom-level control node 1430 and 1431 can be logically connected to top-level control node 1410 by way of mid-level control node 1420. As such, data and rules can be bubbled up (e.g., communicated upward in the hierarchy) or pushed down (e.g., communicated downward in the hierarchy) by way of this communication path. The bidirectional communication and closed loop control at each level (e.g., top, mid, and bottom) can facilitate improved electrical distribution grid performance. For example, where additional power is needed by the industrial customers associated with bottom-level control node 1431, control signals from mid-level control node 1420 can source more power from city power plant by way of bottom-level control node 1430 without directly involving the top-level control node 1410 or draining energy from the illustrated solar farm or wind farm.

Similarly, mid-level control node 1421 can be associated with bottom-level control node 1432 through 1436. Bottom-level control node 1433, for example, can be logically associated with a plurality of transformers service a portion of a city network. Further, for example, bottom-level control node 1434 can be associated with a single transformer as part of a rural network. Moreover, at bottom-level control node 1432, for example, the control node can be associated with a single consumer, such as the farm. The control nodes also can be associated with distributed power generation, for example bottom-level control node 1435 associated with a solar farm and bottom-level control node 1436 associated with a wind farm. As such, bidirectional communication between top-level control node 1410 and bottom-level control node 1432 through 1436 can be by way of mid-level control node 1421. As such, rules propagated for mid-level control node 1420 and associate child control nodes can be different from rules propagated for mid-level control node 1421 and associated child control nodes. Further, independent closed loop control can be affected, for example, at bottom-level control node 1434 and the associated rural customers without impacting bottom-level control node 1433 and the associated city network.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "operator," "switchman," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a memory to store executable instructions; and
a processor coupled to the memory, that executes or facilitates execution of the executable instructions to perform operations, comprising:
generating monitoring data for an electrical energy distribution system that includes power-flow data for the electrical energy distribution system and topology data for the electrical energy distribution system, wherein the power-flow data is indicative of voltage values that are repeatedly obtained from the electrical energy distribution system, and wherein the topology data is indicative of topology information associated with an arrangement of devices in the electrical energy distribution system;
identifying, using the monitoring data that includes the power-flow data and the topology data associated with the arrangement of the devices in the electrical energy distribution system, change in a voltage angle associated with a transmission line in the electrical energy distribution system; and
wherein the change in the voltage angle is utilized to compute a sensitivity of voltage angle separation between a source region and a sink region of the electrical energy distribution system, the source region and sink region being coupled together by a transmission line, wherein the computed sensitivity is utilized to determine whether portions of the electrical energy distribution system including the source region and the sink region are under stress, and when the determination is made that one or more of the portions of the electrical energy distribution system are under stress, modifications to portions of the electrical energy distribution system are made, the modifications being effective to adjust power transmissions and energy flow in the electrical energy distribution system to alleviate the stress and to prevent power outages.

2. The system of claim 1, wherein the operations further comprise generating a notification for a graphical user interface in response to the determination that the change in the voltage angle for the transmission line satisfies a defined criterion.

3. The system of claim 2, wherein the identifying comprises identifying a rate of the change in the voltage angle using a set of defined voltage patterns for the transmission line.

4. The system of claim 1, wherein the identifying comprises identifying the change in the voltage angle associated with the transmission line using a power flow technique that analyzes power flow associated with the transmission line.

5. The system of claim 1, wherein the identifying comprises identifying, using the monitoring data that includes the power-flow data and the topology data, another change in another voltage angle for a device associated with the transmission line.

6. The system of claim 2, wherein the generating comprises modifying a portion of the graphical user interface in response to the determination that the change in the voltage angle for the transmission line satisfies the defined criterion.

7. The system of claim 1, wherein the operations further comprise generating information related to a set of actions for the modifying the portion of the electrical energy distribution system in response to the determination that the change in the voltage angle for the transmission line satisfies a defined criterion.

8. The system of claim 1, wherein the operations further comprise repeatedly obtaining the power-flow data from the electrical energy distribution system during an interval of time that is less than one second.

9. The system of claim 1, wherein the operations further comprise repeatedly obtaining the power-flow data from the electrical energy distribution system via a phasor measurement device communicatively coupled to the transmission line.

10. The system of claim 1, wherein the operations further comprise identifying, using the change in the voltage angle for the transmission line, a power outage associated with the electrical energy distribution system.

11. The system of claim 1, wherein the operations further comprise detecting congestion associated with the electrical energy distribution system in response to a determination, using the change in the voltage angle, that an amount of a power supply to a device associated with the transmission line is below a defined threshold level.

12. A method, comprising:
generating, by a system comprising a processor, topology data that is indicative of an arrangement and a power status of devices in an electrical energy distribution system;
generating, by the system, power-flow data that is indicative of voltage parameters associated with the electrical energy distribution system;
identifying, by the system and using the power-flow data and the topology data indicative of the arrangement and the power status of the devices in the electrical energy distribution system, a change in a voltage angle associated with a transmission line coupled between a first location and a second location in the electrical energy distribution system; and
wherein the change in the voltage angle is utilized to compute a sensitivity of voltage angle separation between the first region and the second region of the electrical energy distribution system, the first region and second region being coupled together by a transmission line, wherein the computed sensitivity is utilized to determine whether portions of the electrical energy distribution system including the first region and the second region are under stress, and when the determination is made that one or more of the portions of the electrical energy distribution system are under stress, modifications to portions of the electrical energy distribution system are made, the modifications being effective to adjust power transmissions and energy flow in the electrical energy distribution system to alleviate the stress and to prevent power outages.

13. The method of claim 12, wherein the identifying comprises identifying a rate of the change in the voltage angle during an interval of time.

14. The method of claim 12, wherein the generating the power-flow data comprises repeatedly obtaining the power-flow data from the electrical energy distribution system during an interval of time.

15. The method of claim 12, wherein the generating the power-flow data comprises repeatedly obtaining the power-flow data from the electrical energy distribution system via a phasor measurement device communicatively coupled to the transmission line.

16. The method of claim 12, further comprising:
displaying, by the system, information related to a set of actions for the altering in response to the determination that the change in the voltage angle for the transmission line satisfies a defined criterion.

17. The method of claim 12, further comprising:
displaying, by the system, information related to a power outage in the electrical energy distribution system in response to the determination that the change in the voltage angle for the transmission line satisfies a defined criterion.

18. A non-transitory computer readable storage device comprising executable instructions that, in response to execution, cause a device comprising a processor to perform operations, comprising:

obtaining topology data that is indicative of a topology calculation for an arrangement of devices in a power grid system;

repeatedly obtaining power-flow data during a period of time, the power-flow data being indicative of voltage parameters associated with the power grid system;

identifying, using the power-flow data and the topology data indicative of the topology calculation for the arrangement of the devices in the power grid system, a change in a voltage angle associated with a transmission line in the power grid system; and wherein the change in the voltage angle is utilized to compute a sensitivity of voltage angle separation between a source region and a sink region of the electrical energy distribution system, the source region and sink region being coupled together by a transmission line, wherein the computed sensitivity is utilized to determine whether portions of the electrical energy distribution system including the source region and the sink region are under stress, and when the determination is made that one or more of the portions of the electrical energy distribution system are under stress, modifications to portions of the electrical energy distribution system are made, the modifications being effective to adjust power transmissions and energy flow in the electrical energy distribution system to alleviate the stress and to prevent power outages.

19. The non-transitory computer readable storage device of claim 18, wherein the identifying comprises identifying a rate of the change in the voltage angle during another period of time.

20. The non-transitory computer readable storage device of claim 18, wherein the identifying comprises identifying a rate of the change in the voltage angle based on a set of defined voltage patterns for the power grid system.

* * * * *